(12) United States Patent
Cheng et al.

(10) Patent No.: US 11,963,469 B2
(45) Date of Patent: Apr. 16, 2024

(54) PHASE CHANGE MEMORY CELL WITH AN AIRGAP TO ALLOW FOR THE EXPANSION AND RESTRICTION OF THE PCM MATERIAL

(71) Applicant: INTERNATIONAL BUSINESS MACHINES CORPORATION, Armonk, NY (US)

(72) Inventors: Kangguo Cheng, Schenectady, NY (US); Ruilong Xie, Niskayuna, NY (US); Carl Radens, LaGrangeville, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/317,123

(22) Filed: May 15, 2023

(65) Prior Publication Data
US 2023/0284542 A1 Sep. 7, 2023

Related U.S. Application Data

(62) Division of application No. 17/303,836, filed on Jun. 9, 2021, now Pat. No. 11,690,305.

(51) Int. Cl.
*H10N 70/00* (2023.01)
*G11C 13/00* (2006.01)

(52) U.S. Cl.
CPC ....... *H10N 70/841* (2023.02); *G11C 13/0004* (2013.01); *H10N 70/011* (2023.02);
(Continued)

(58) Field of Classification Search
CPC ............... H10N 70/841; H10N 70/011; H10N 70/8265; H10N 70/8825; H10N 70/8828;
(Continued)

(56) References Cited

U.S. PATENT DOCUMENTS 7,928,421 B2  4/2011  Lung
8,026,503 B2  9/2011  Tu
(Continued)

FOREIGN PATENT DOCUMENTS

WO   2022257764 A1   12/2022

OTHER PUBLICATIONS

Notification of Transmittal of The International Search Report and The Written Opinion of The International Searching Authority, or The Declaration, dated Aug. 8, 2022, Applicant's or agent's file reference F22W2010, International application No. PCT/CN2022/094882, 10 pages.
(Continued)

*Primary Examiner* — Jerome Leboeuf
(74) *Attorney, Agent, or Firm* — Samuel A. Waldbaum

(57) ABSTRACT

A phase change memory (PCM) cell comprising a substrate a first electrode located on the substrate. A phase change material layer located adjacent to the first electrode, wherein a first side of the phase change material layer is in direct contact with the first electrode. A second electrode located adjacent to phase change material layer, wherein the second electrode is in direct contact with a second side of the phase change material layer, wherein the first side and the second side are different sides of the phase change material layer. An airgap is located directly above the phase change material layer, wherein the airgap provides space for the phase change material to expand or restrict.

20 Claims, 27 Drawing Sheets

(52) U.S. Cl.
CPC ..... *H10N 70/8265* (2023.02); *H10N 70/8825* (2023.02); *H10N 70/8828* (2023.02)

(58) Field of Classification Search
CPC .. H10N 70/023; H10N 70/063; H10N 70/066; H10N 70/231; G11C 13/0004; H10B 63/80
See application file for complete search history.

(56) References Cited

U.S. PATENT DOCUMENTS

| | | |
|---|---|---|
| 8,288,750 B2 | 10/2012 | Shen |
| 8,759,810 B2 | 6/2014 | Agarwal |
| 10,381,366 B1 | 8/2019 | Takahashi |
| 10,505,111 B1 | 12/2019 | Ok |
| 2006/0003515 A1 | 1/2006 | Chang |
| 2006/0226409 A1 | 10/2006 | Burr |
| 2007/0115794 A1 | 5/2007 | Lung |
| 2009/0101880 A1 | 4/2009 | Tu |
| 2009/0191367 A1 | 7/2009 | Chen |
| 2011/0266511 A1* | 11/2011 | Shen .................. H10N 70/8413 257/3 |
| 2011/0284815 A1 | 11/2011 | Kim |
| 2020/0006652 A1 | 1/2020 | Cheng |
| 2022/0399493 A1 | 12/2022 | Cheng |

OTHER PUBLICATIONS

IBM: List of IBM Patents or Patent Applications Treated as Related (Appendix P), May 15, 2023, 2 pages.

* cited by examiner

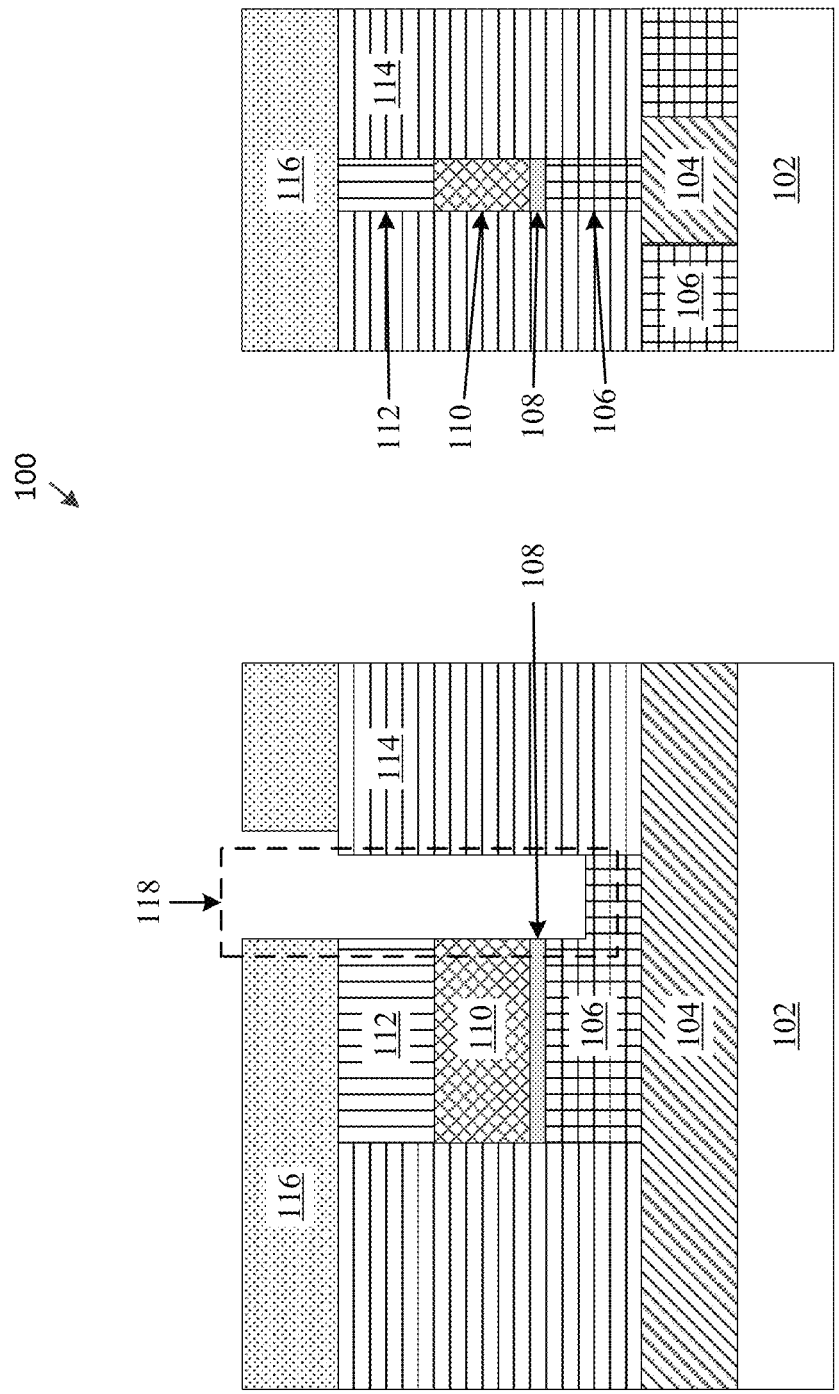

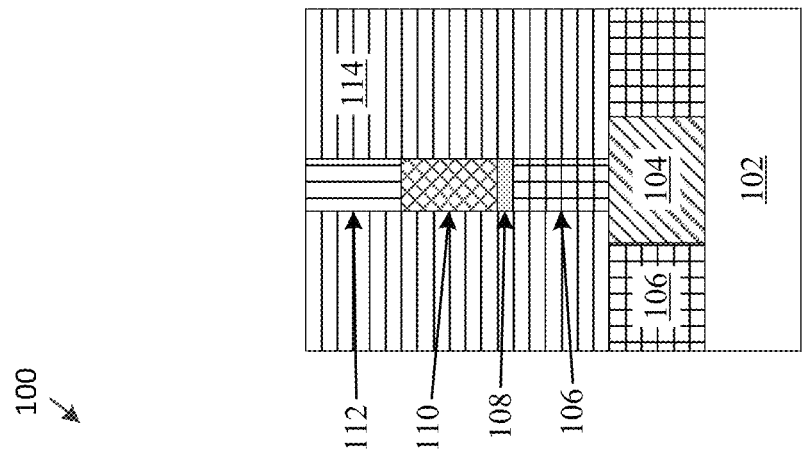
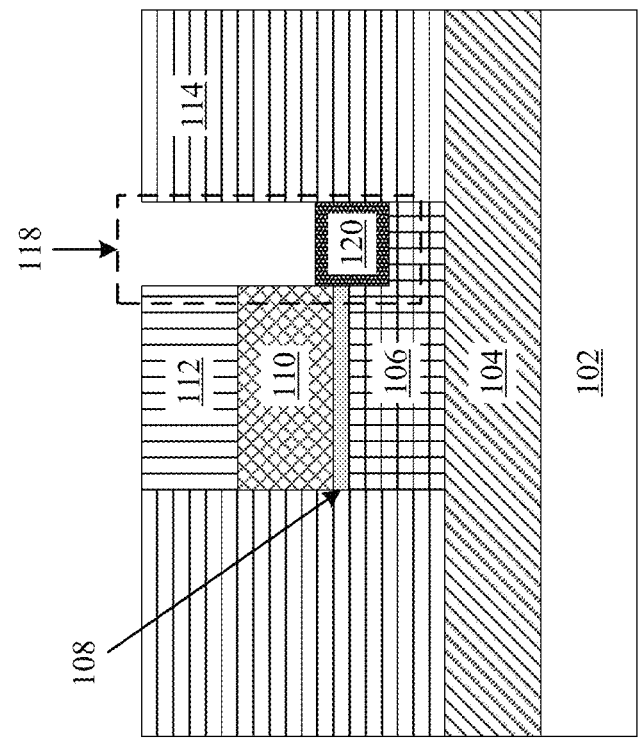
FIG. 4B
FIG. 4A

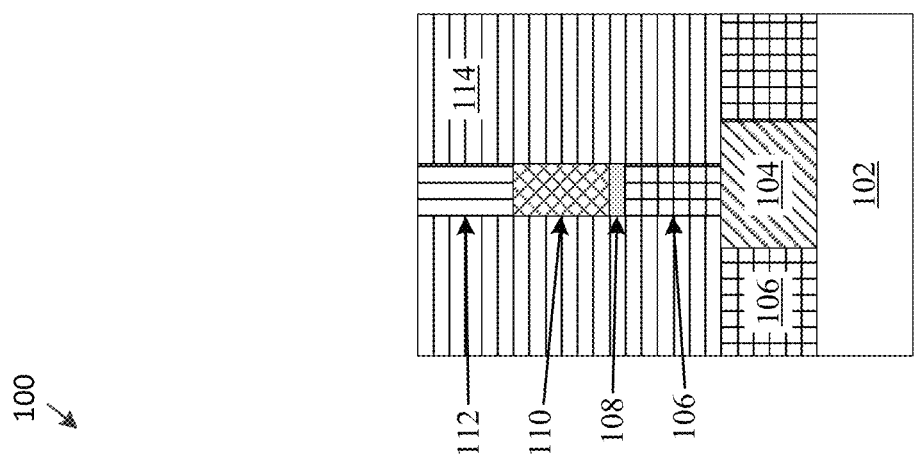
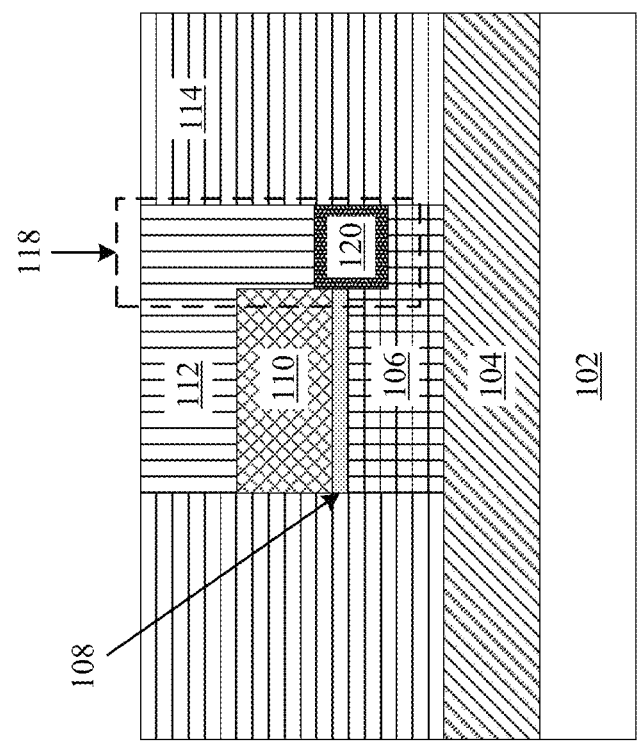
FIG. 5B
FIG. 5A

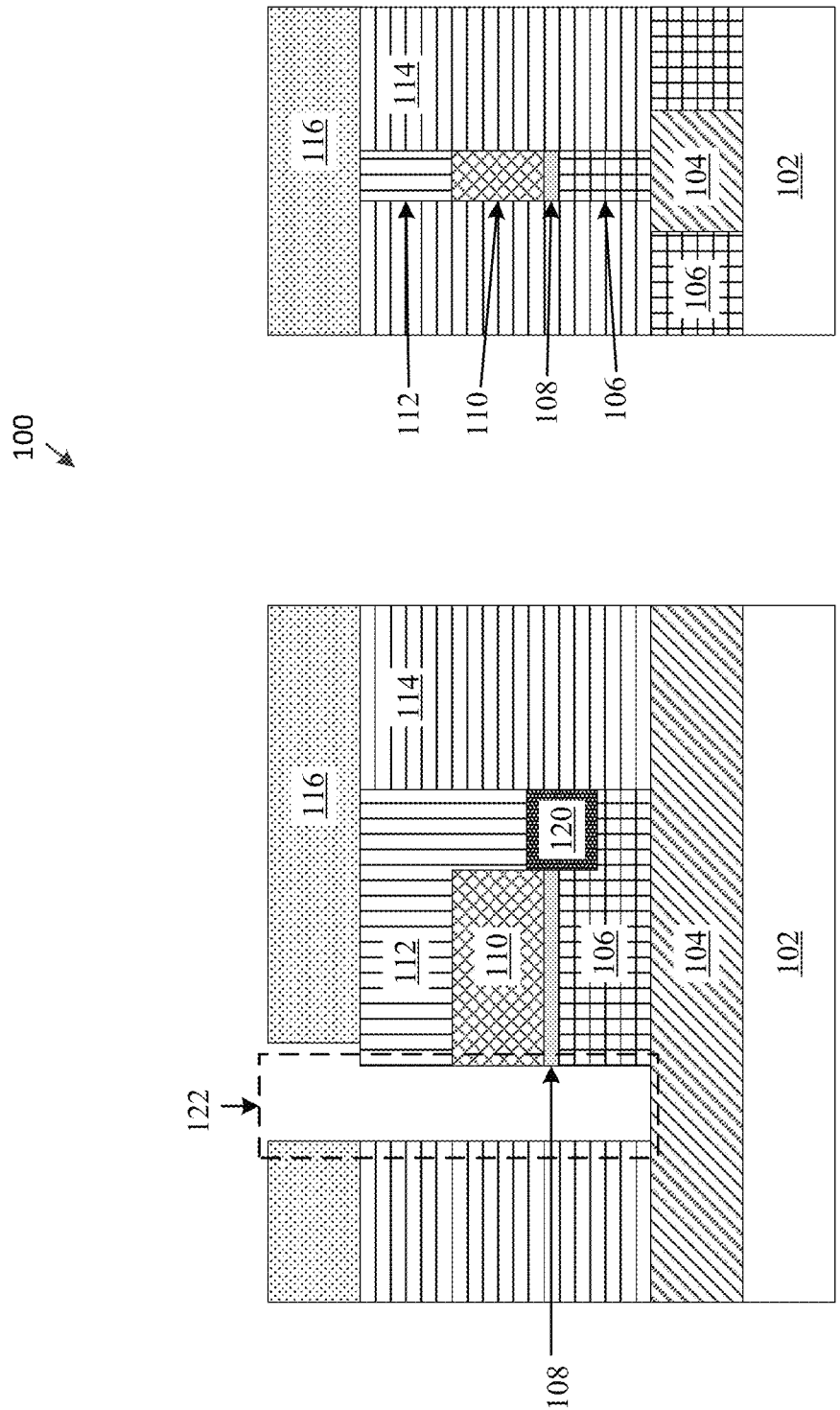

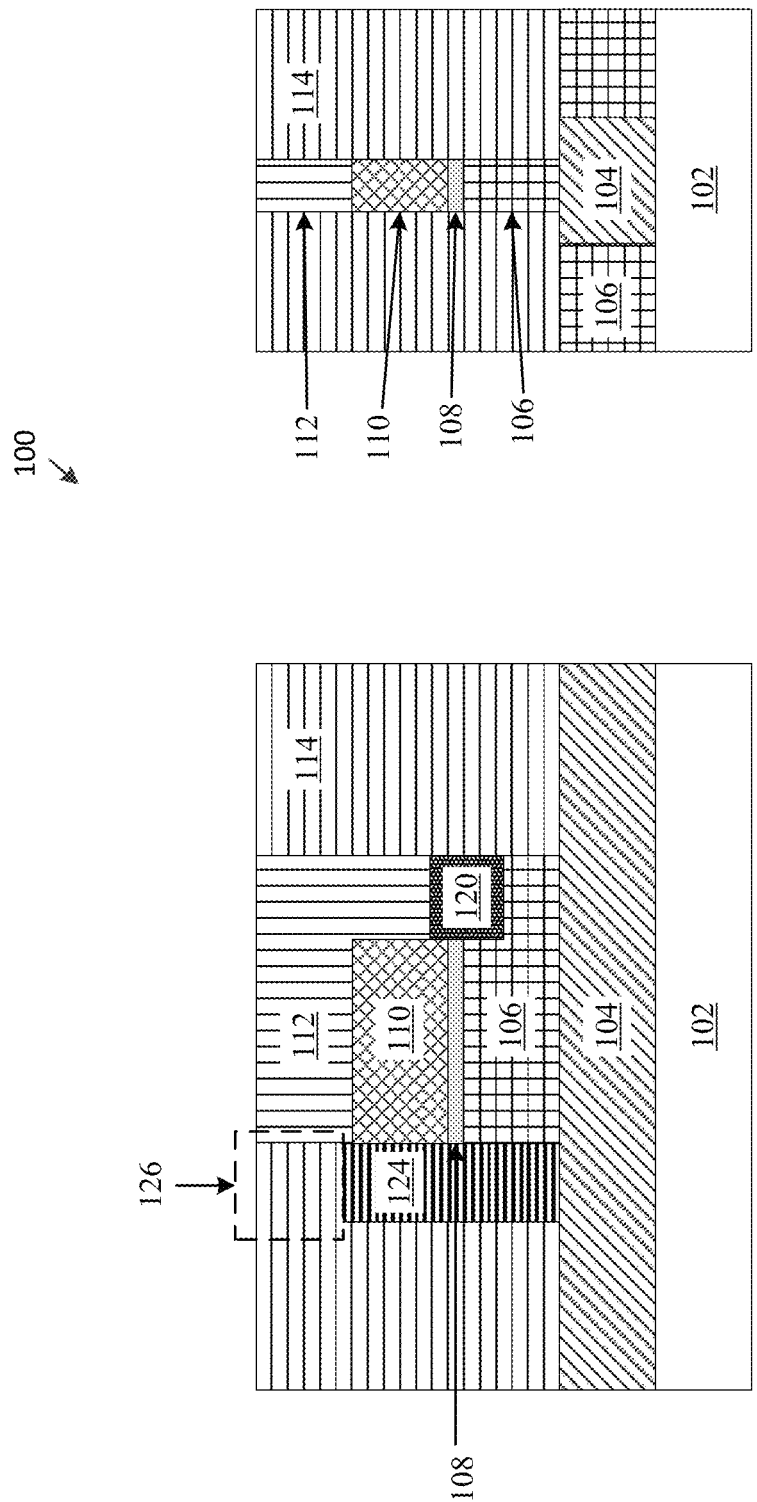

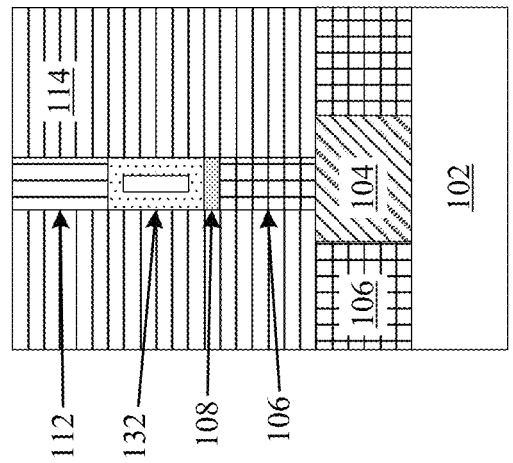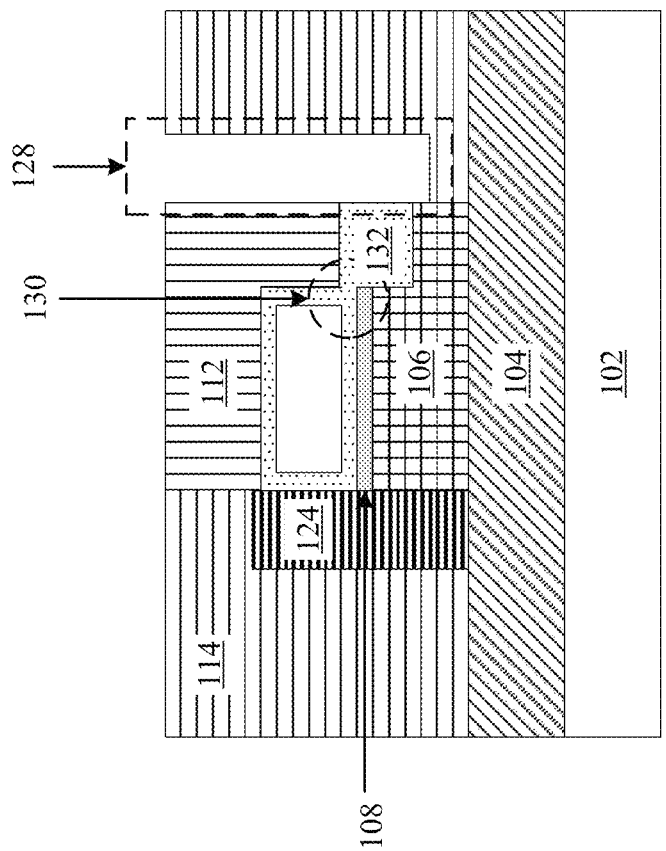
FIG. 11A
FIG. 11B

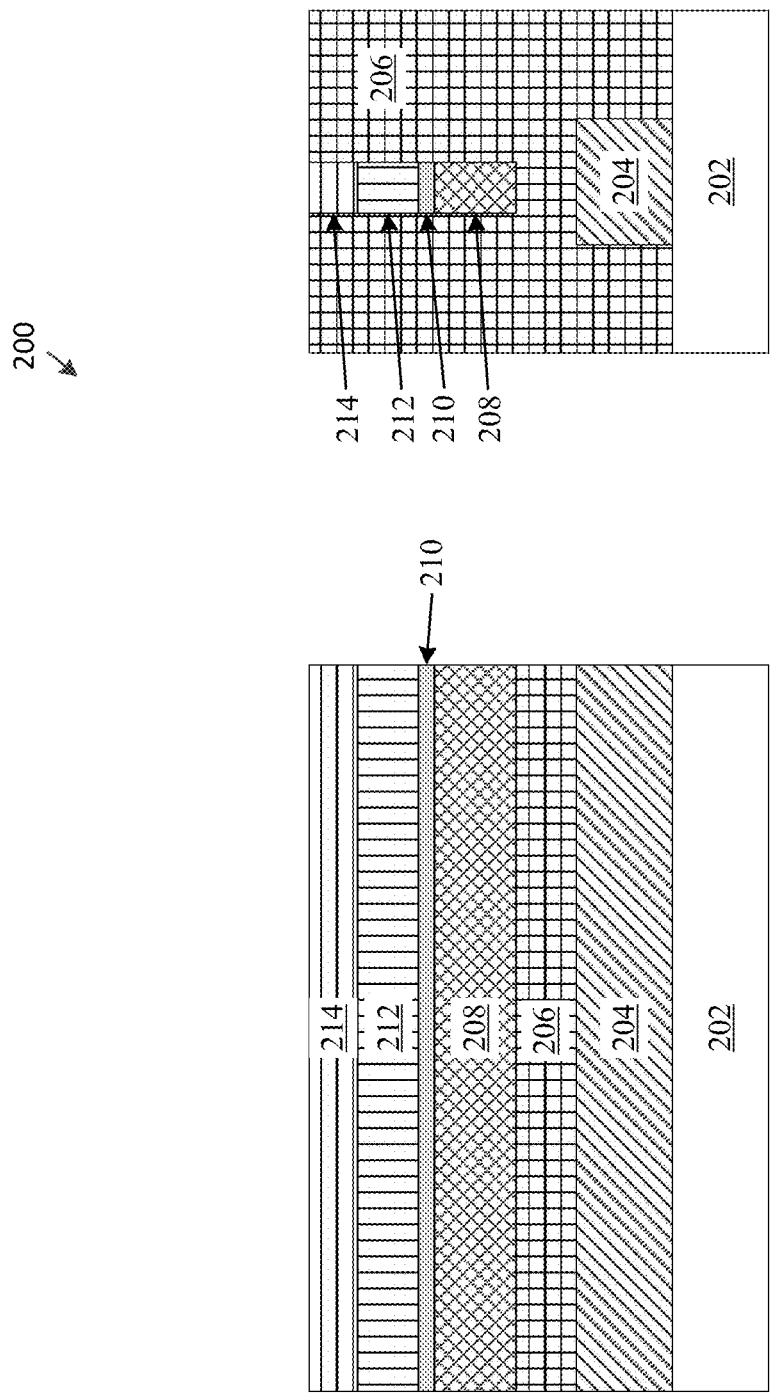

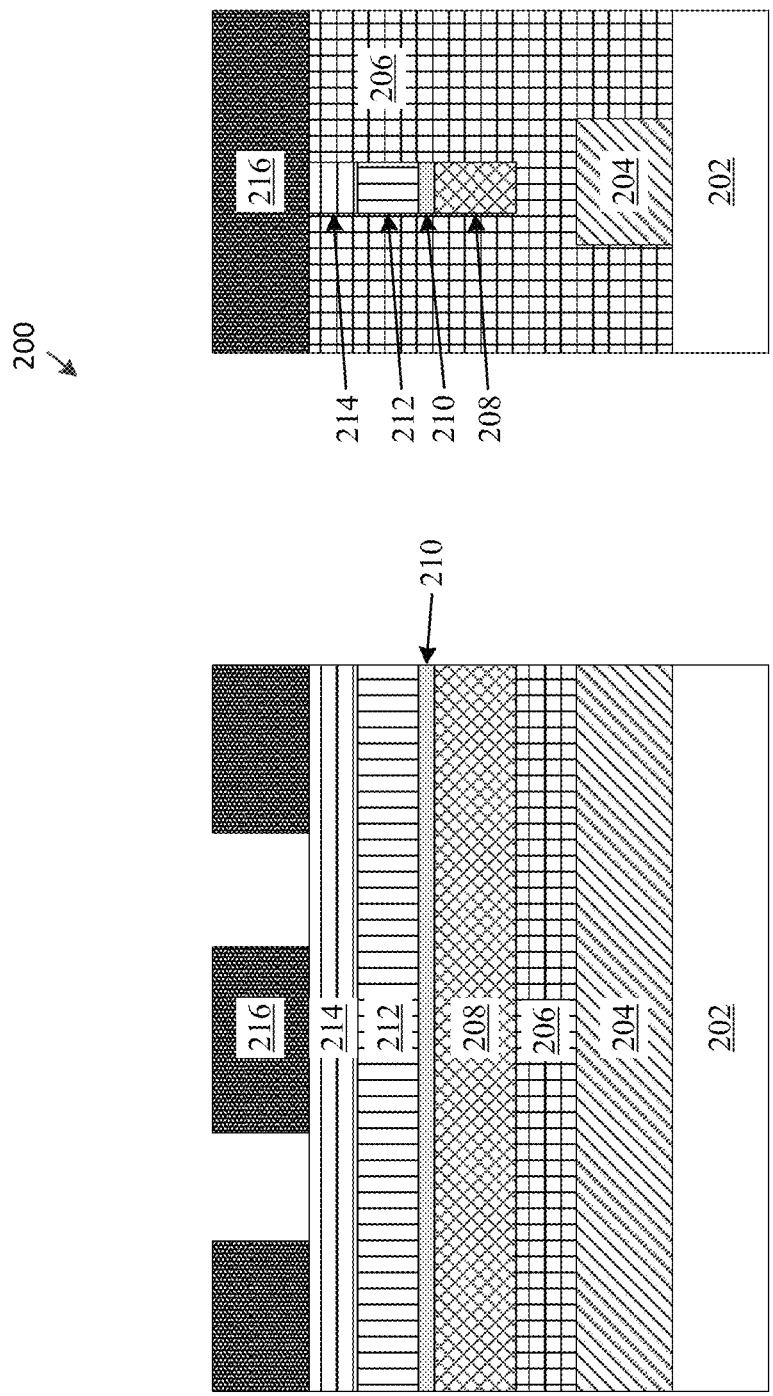

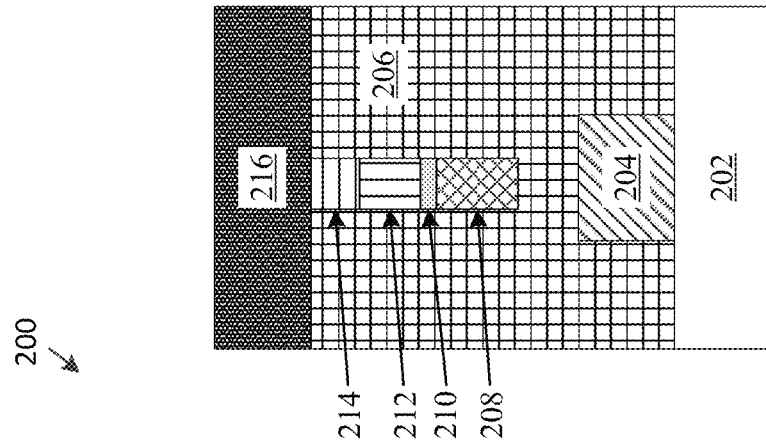
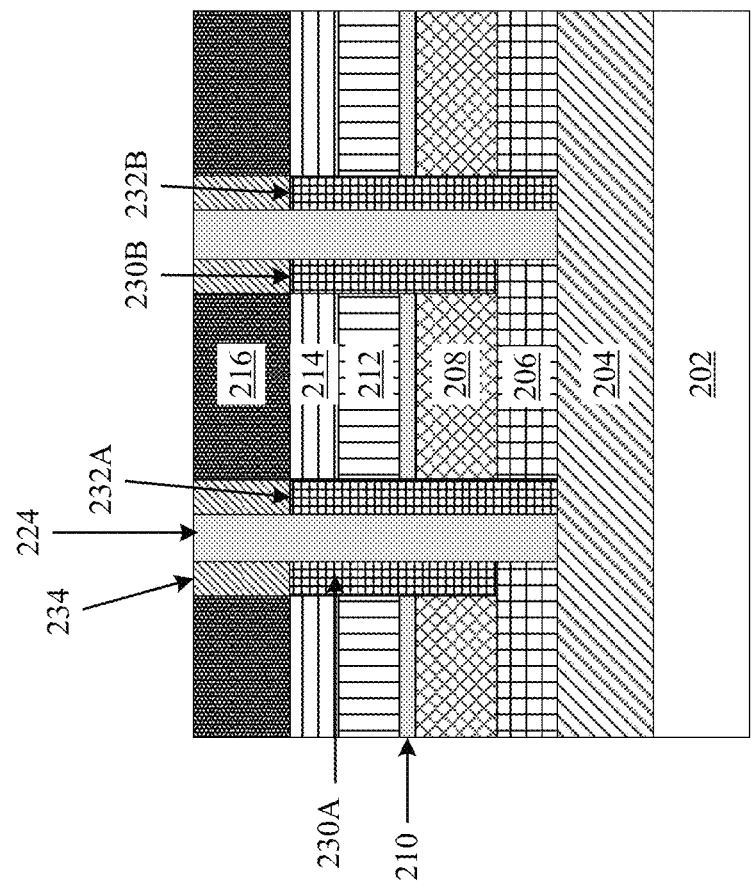
FIG. 21B
FIG. 21A

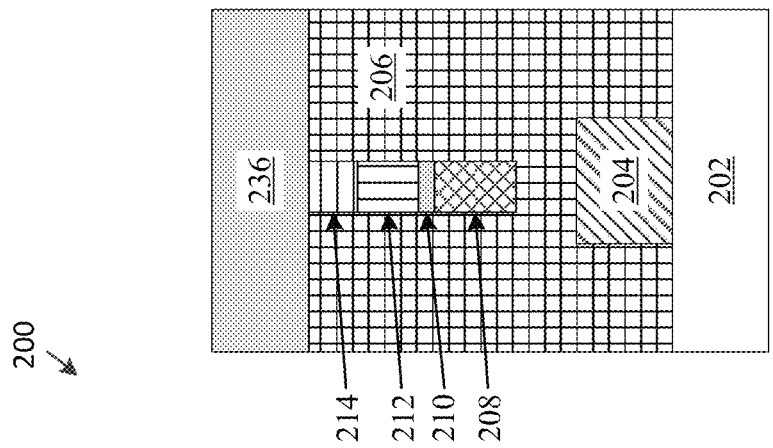
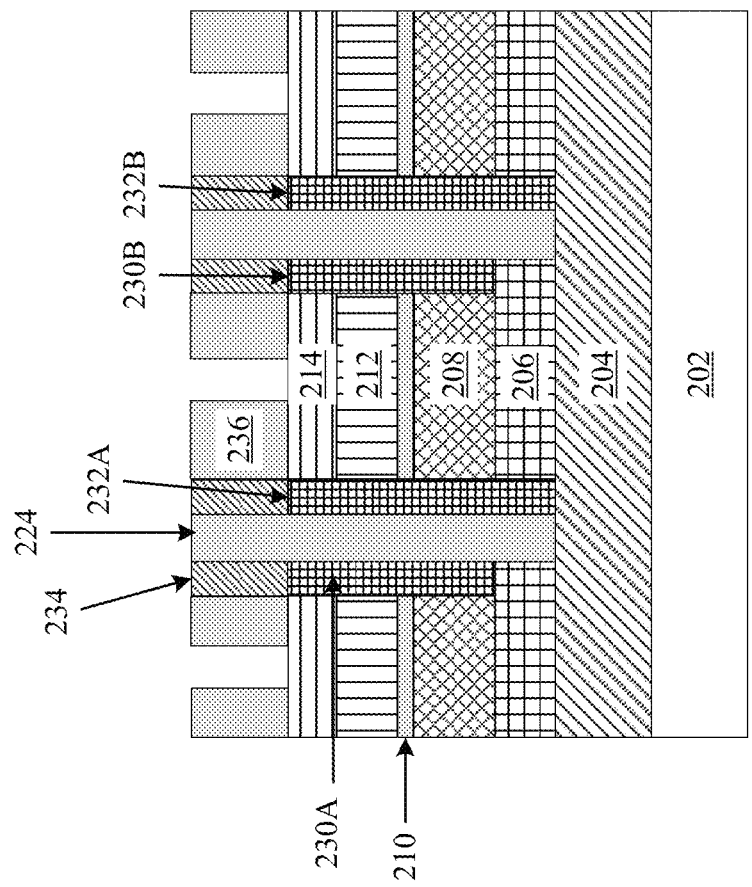
FIG. 22B
FIG. 22A

PHASE CHANGE MEMORY CELL WITH AN AIRGAP TO ALLOW FOR THE EXPANSION AND RESTRICTION OF THE PCM MATERIAL

BACKGROUND

The present invention generally relates to the field of phase change memory cells, and more particularly to a phase change memory cell with a one-sided airgap to accommodate volume change during operation.

Phase change memory (PCM) has been pursued as a leading candidate as memory used in artificial intelligence (AI) deep learning applications. A PCM cell is confined by rigid walls/boundaries so there is no space available for the PCM material to expand or restrict. This causes endurance or reliability issues because of the volume changes of the PCMs during normal operational cycles can be hindered/damaged by the rigid walls.

BRIEF SUMMARY

Additional aspects and/or advantages will be set forth in part in the description which follows and, in part, will be apparent from the description, or may be learned by practice of the invention.

A phase change memory (PCM) cell comprising a substrate a first electrode located on the substrate. A phase change material layer located adjacent to the first electrode, wherein a first side of the phase change material layer is in direct contact with the first electrode. A second electrode located adjacent to phase change material layer, wherein the second electrode is in direct contact with a second side of the phase change material layer, wherein the first side and the second side are different sides of the phase change material layer. An airgap is located directly above the phase change material layer, wherein the airgap provides space for the phase change material to expand or restrict.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 3A illustrates cross section A of the PCM device after the creation of a column, in accordance with the embodiment of the present invention.

FIG. 3B illustrates cross section B of the PCM device after the creation of the column, in accordance with the embodiment of the present invention.

FIG. 4A illustrates cross section A of the PCM device after formation of a sacrificial layer, in accordance with the embodiment of the present invention.

FIG. 4B illustrates cross section B of the PCM device after the formation of the sacrificial layer, in accordance with the embodiment of the present invention.

FIG. 5A illustrates cross section A of the PCM device after filling in the column, in accordance with the embodiment of the present invention.

FIG. 5B illustrates cross section B of the PCM device after filling in the column, in accordance with the embodiment of the present invention.

FIG. 6A illustrates cross section A of the PCM device after the creation of the second column, in accordance with the embodiment of the present invention.

FIG. 6B illustrates cross section B of the PCM device after the creation of a second column, in accordance with the embodiment of the present invention.

FIG. 7A illustrates cross section A of the PCM device after the creation of a first electrode, in accordance with the embodiment of the present invention.

FIG. 7B illustrates cross section B of the PCM device after the creation of the first electrode, in accordance with the embodiment of the present invention.

FIG. 11A illustrates cross section A of the PCM device after the PCM layer is removed from the third column, in accordance with the embodiment of the present invention.

FIG. 11B illustrates cross section B of the PCM device after the PCM layer is removed from the third column in accordance with the embodiment of the present invention.

FIG. 15A illustrates cross section A of the PCM device after a material stack formation, in accordance with the embodiment of the present invention.

FIG. 15B illustrates cross section B of the PCM device after the material stack formation, in accordance with the embodiment of the present invention.

FIG. 16A illustrates cross section A of the PCM device after formation of an amorphous layer, in accordance with the embodiment of the present invention.

FIG. 16B illustrates cross section B of the PCM device after formation of the amorphous layer, in accordance with the embodiment of the present invention.

FIG. 21A illustrates cross section A of the PCM device after formation of a second spacer, in accordance with the embodiment of the present invention.

FIG. 21B illustrates cross section B of the PCM device after formation of the second spacer, in accordance with the embodiment of the present invention.

FIG. 22A illustrates cross section A of the PCM device after formation of a third spacer, in accordance with the embodiment of the present invention.

FIG. 22B illustrates cross section B of the PCM device after formation of the third spacer, in accordance with the embodiment of the present invention.

DETAILED DESCRIPTION

Figure 1:
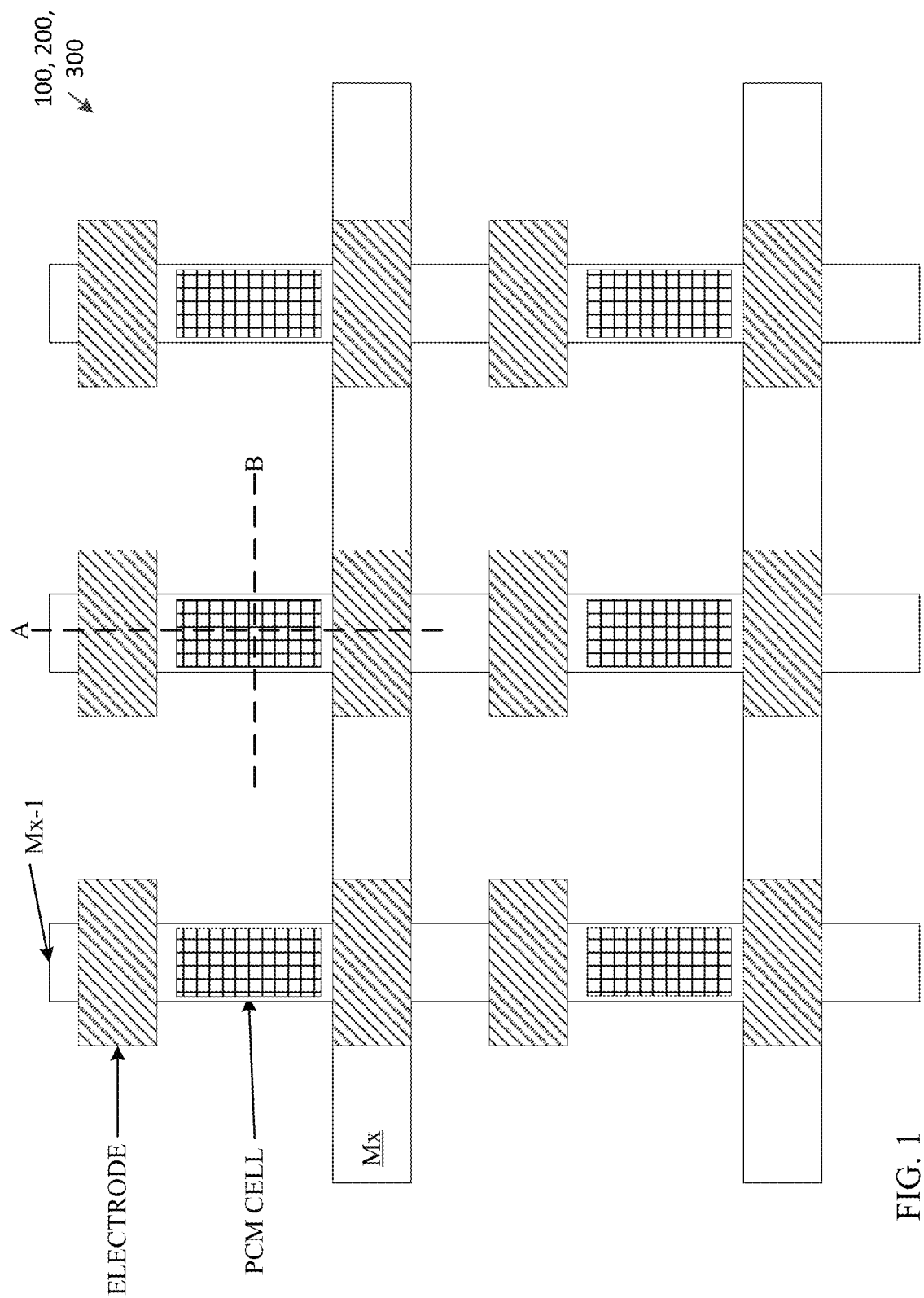
FIG. 1 illustrates a top-down view of Phase Change Memory device, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. Phase change memory (PCM) is comprised of a material that changes its volume during normal operations as an electrical current/pulse is applied/not applied to the PCM material. There is about a 6-7% volume expansion when the PCM material changes from a crystalline state to an amorphous state during a RESET operation. There is about 6-7% volume shrinkage when the PCM material changes from the amorphous state to the crystalline state during a SET operation. The present invention is directed to forming an airgap to accommodate the volume changes of the PCM material.

FIG. 1 illustrates a top-down view of Phase Change Memory (PCM) device 100, 200, 300, in accordance with an embodiment of the present invention. FIG. 1 illustrates a top-down view of the memory array that includes PCM memory cells, electrodes, Mx lines (metal lines), Mx−1 lines (metal lines). Cross section A and cross section B are identified, and the following figures reflect the fabrication stages at these cross sections.

Figures 2A, 2B:
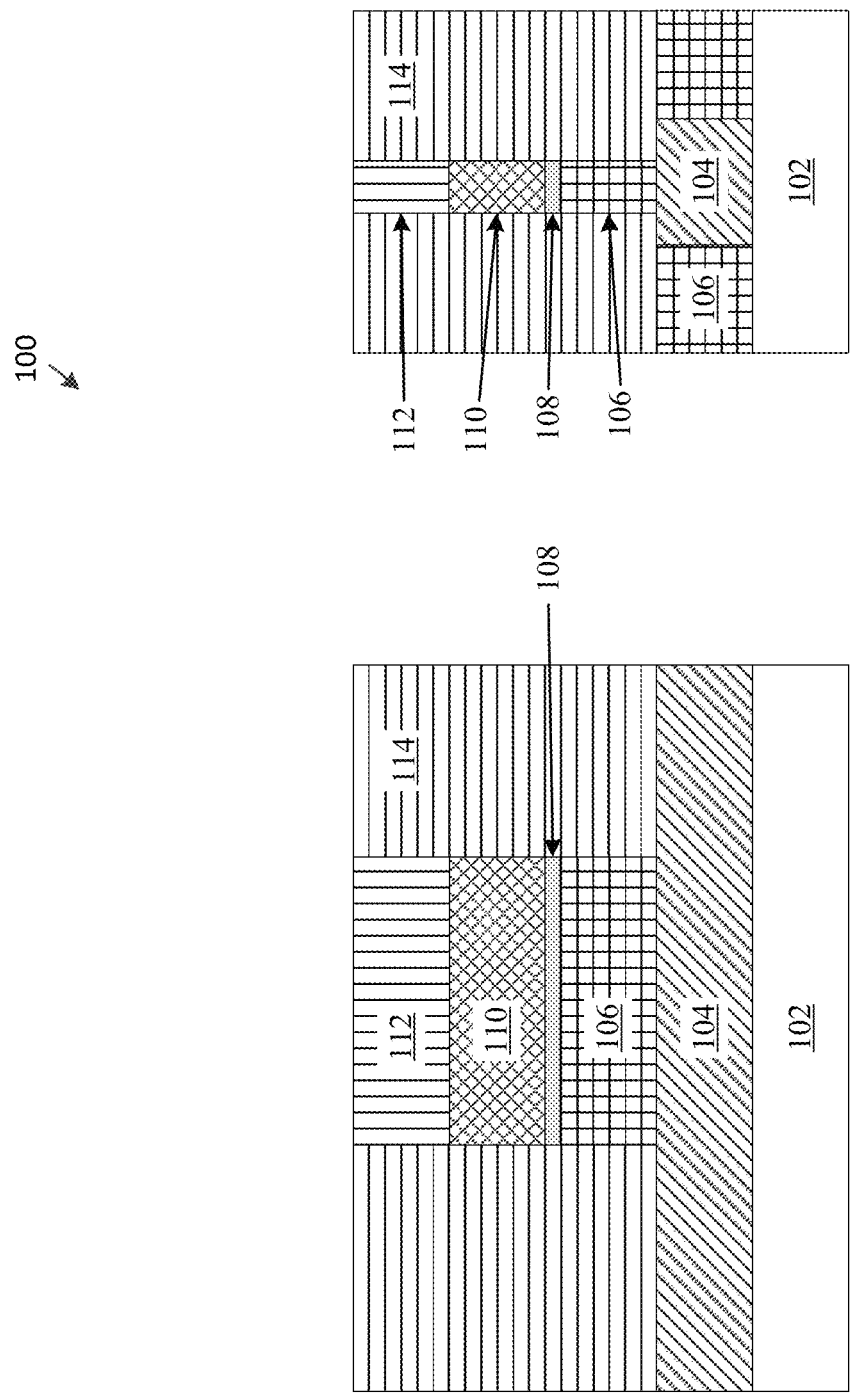
FIG. 2A illustrates cross section A of the PCM device after a material stack formation, in accordance with the embodiment of the present invention.
FIG. 2B illustrates cross section B of the PCM device after the material stack formation, in accordance with the embodiment of the present invention.

FIG. 2A illustrates cross section A of the PCM device 100 after a material stack formation, in accordance with the embodiment of the present invention. FIG. 2B illustrates cross section B of the PCM device 100 after the material stack formation, in accordance with the embodiment of the present invention. The PCM device 100 includes a substrate 102, a bottom metal line 104, a first dielectric layer 106, an optional resistive liner 108, a first sacrificial layer 110, a hard mask 112, and an interlayer dielectric (ILD) layer 114. The substrate 102 can be, for example, a material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate 102. In some embodiments, the substrate 102 includes both semiconductor materials and dielectric materials. The semiconductor substrate 102 may also comprise an organic semiconductor or a layered semiconductor such as, for example, Si/SiGe, a silicon-on-insulator or a SiGe-on-insulator. A portion or entire semiconductor substrate 102 be amorphous, polycrystalline, or monocrystalline. The semiconductor substrate 102 may be doped, undoped or contain doped regions and undoped regions therein. In some embodiments, the substrate 102 includes other device structures (not shown) such as transistors, isolation structures (such as shallow trench isolations), contacts, conducting wires, etc., or any suitable layer that can act as the base for the PCM device 100. The first sacrificial layer 110 can be comprised of, for example, germanium. The resistive liner 108 can be comprised of for example, for example, amorphous carbon, tantalum nitride (TaN), tungsten nitride (WN), cobalt tungsten (CoW), nickel tungsten (NiW), yttrium oxide (YO), or any other suitable materials. The resistance of the resistive liner 108 is substantially greater than the resistance of the PCM material in low resistance state (e.g., ten to forty times higher, or about twenty times higher) and substantially lower than the resistance of the PCM material in high resistance state (e.g., five to fifty times lower, or about ten times lower). The first dielectric layer 106 can be comprised of, for example, SiN or any other suitable dielectric material.

FIG. 3A illustrates cross section A of the PCM device 100 after creation of a column 118, in accordance with the embodiment of the present invention. FIG. 3B illustrates cross section B of the PCM device 100 after creation of the column 118, in accordance with the embodiment of the present invention. In an embodiment, an optical patterning layer (OPL) 116 is formed on top of the hard mask 112 and the ILD layer 114. The OPL 116 is patterned for the formation of column 118. The OPL 116 serves as the masking layer. The column 118 is an empty space formed by removing a portion of material from each of the hard mask 112, the first sacrificial layer 110, the resistive liner 108, and the first dielectric layer 106. The bottom of column 118 is located in the first dielectric layer 106, however the column 118 does not extent down to the bottom metal line 104.

FIG. 4A illustrates cross section A of the PCM device 100 after formation of a sacrificial layer, in accordance with the embodiment of the present invention. FIG. 4B illustrates cross section B of the PCM device 100 after formation of the sacrificial layer, in accordance with the embodiment of the present invention. The OPL 116 and any excess material of the second sacrificial layer 120 formed on top of the OPL 116 is removed. A second sacrificial layer 120 is formed in the bottom of the column 118. The second sacrificial layer 120 has a vertical height that overlaps with a portion of the first sacrificial layer 110. The second sacrificial layer 120 can be comprised of, for example, Ge, SiGe or another suitable sacrificial material. The vertical height of the second sacrificial layer 120 allows for a formation of a bottleneck during the downstream processing of the PCM device 100.

FIG. 5A illustrates cross section A of the PCM device 100 after filling in the column 118, in accordance with the embodiment of the present invention. FIG. 5B illustrates cross section B of the PCM device 100 after filling in the column 118, in accordance with the embodiment of the present invention. Additional hard mask 112 material is formed on the exposed surfaces of the PCM device 100. The additional hard mask 112 material fills the empty space located in column 118. The hard mask 112 material is planarized to expose a uniform surface of the hard mask 112 and the ILD layer 114. The hard mask 112 extends downwards so that a portion of the hard mask 112 is in contact with the top of the second sacrificial layer 120. The hard mask 112 extending downwards allows for a bottleneck to be formed between the hard mask 112 and the resistive liner 108, during downstream processing of the PCM device 100.

FIG. 6A illustrates cross section A of the PCM device 100 after creation of a second column, in accordance with the embodiment of the present invention. FIG. 6B illustrates cross section B of the PCM device 100 after creation of the second column, in accordance with the embodiment of the present invention. An OPL 116 is formed on top of the hard mask 112 and on top of the ILD layer 114. The OPL 116 is patterned for the formation of a second column 122, which determines the location for the formation of the first electrode 124, which will be described below. The second column 122 is located on a different side of the stack from where the first column 118 was located. Removal of a portion from each of the hard mask 112, the first sacrificial layer 110, the resistive liner 108, and the first dielectric layer 106 forms the empty space that comprises the second column 122. The second column 122 extends downward to expose the top surface of the bottom metal line 104.

FIG. 7A illustrates cross section A of the PCM device 100 after creation of a first electrode 124, in accordance with the embodiment of the present invention. FIG. 7B illustrates cross section B of the PCM device after creation of the first electrode 124, in accordance with the embodiment of the present invention. A first electrode 124 is formed in the second column 122, where the bottom of the first electrode 124 is in direct contact with the bottom metal line 104. The first electrode 124 is formed by depositing a conductive metal on the exposed surfaces to form the first electrode 124 in the second column 122. The first electrode 124 extends upwards from the bottom metal line 104, such that, the top surface of the first electrode 124 is higher than the top surface of the first sacrificial layer 110. The first electrode 124 can be comprised of, for example, tungsten (W), copper (Cu), cobalt (Co), tantalum nitride (TaN) titanium nitride (TiN), ruthenium (Ru), or any other suitable conductive metal. The first electrode 124 can comprise a single conductive material or any suitable combination of conductive materials. Additional ILD layer 114 material is deposited to fill in the remainder of the column 122, as illustrated by the dashed box 126. The OPL 116, excess material to form the first electrode 124 and the excess ILD layer 114 is planarized by a CMP process to form a planarized surface. The planarization makes a planar surface across the top of the ILD layer 114 and the top of the hard mask 112.

Figure 8B:
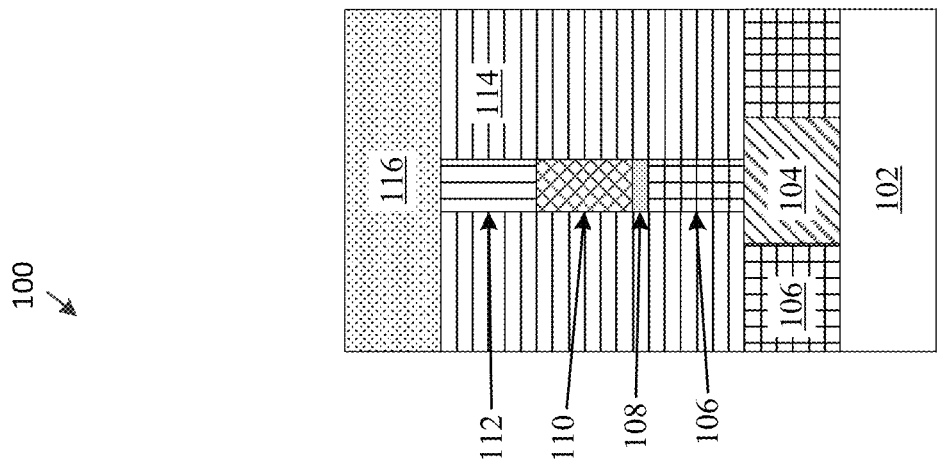
FIG. 8B illustrates cross section B of the PCM device after the creation of the third column, in accordance with the embodiment of the present invention.
Figure 8A:
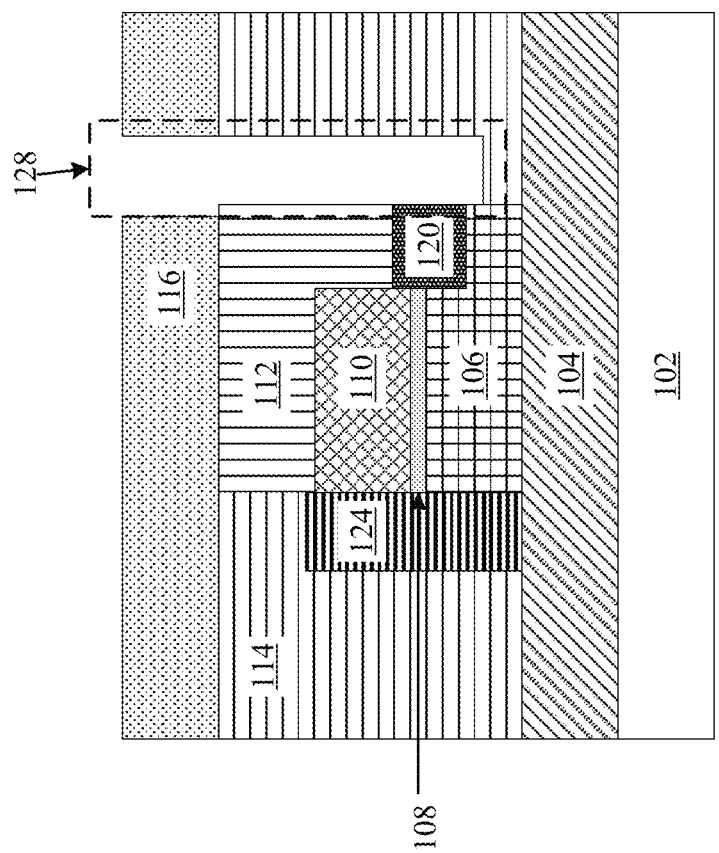
FIG. 8A illustrates cross section A of the PCM device after the creation of a third column, in accordance with the embodiment of the present invention.

FIG. 8A illustrates cross section A of the PCM device 100 after creation of a third column, in accordance with the embodiment of the present invention. FIG. 8B illustrates cross section B of the PCM device 100 after creation of the third column, in accordance with the embodiment of the present invention. An OPL 116 or any other suitable masking layer is formed on top of the hard mask 112 and the ILD layer 114. The OPL 116 is patterned for the formation of a third column 128, where the third column 128 is located adjacent to the location of the first column 118. Removal of a portion of the ILD layer 114 material adjacent to the hard mask 112 and the second sacrificial layer 120 forms the empty space that comprises the third column 128. The removal of the portion of the ILD layer 114 to form the third column 128 exposes a side of the hard mask 112 and a side of the second sacrificial layer 120. The second column 122 extends downwards below the bottom surface off the second sacrificial layer 120.

Figure 9B:
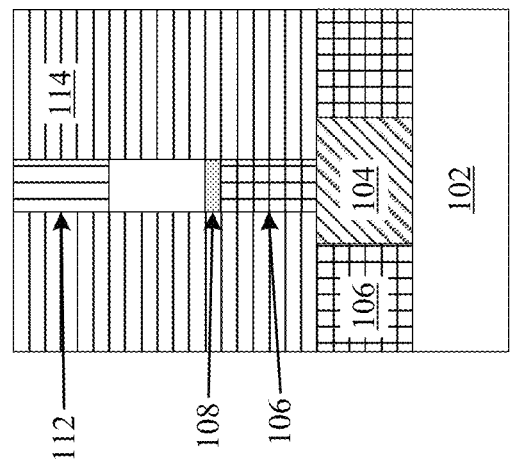
FIG. 9B illustrates cross section B of the PCM device after the sacrificial layers have been removed, in accordance with the embodiment of the present invention.
Figure 9A:
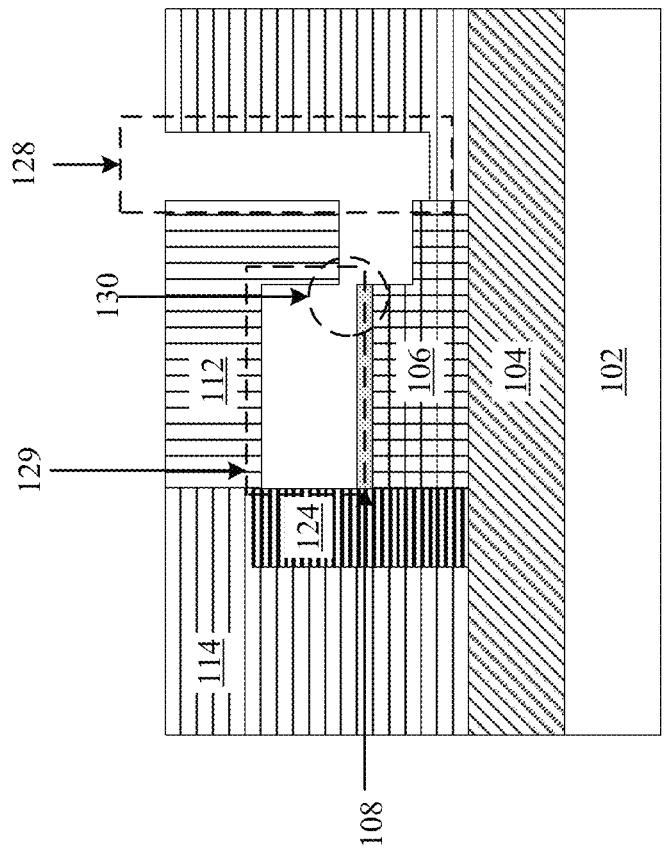
FIG. 9A illustrates cross section A of the PCM device after the sacrificial layers have been removed, in accordance with the embodiment of the present invention.

FIG. 9A illustrates cross section A of the PCM device 100 after the sacrificial layers have been removed, in accordance with the embodiment of the present invention. FIG. 9B illustrates cross section B of the PCM device 100 after the sacrificial layers have been removed, in accordance with the embodiment of the present invention. The OPL 116 is removed to expose the top surfaces of the ILD layer 114 and the top of the hard mask 112. The first sacrificial layer 110 and the second sacrificial layer 120 are removed. The removal of the first sacrificial layer 110 and the second sacrificial layer 120 causes the creation of a cavity 129 where these layers were located. The cavity 129 is defined by a bottom wall of the optional resistive liner 108 (or the first dielectric layer 106 when there is no resistive liner 108). The first electrode 124 makes acts as first sidewall of the cavity 129. The hard mask 112 acts as the top wall of the cavity 129 and the hard mask 112 acts as a second sidewall of the cavity 129. A bottleneck 130 is exposed by the removal of the first and second sacrificial layers 110 and 120. The bottleneck 130 is formed by a portion of the hard mask 112 that is extending downwards and the end of the resistive liner 108. In some embodiments, the first sacrificial layer 110 and the second sacrificial layer 120 comprise SiGe or Ge which can be removed, for example, by an aqueous solution containing ammonia and hydrogen peroxide, or by a gas phase hydrogen chloride (HCl).

Figure 10B:
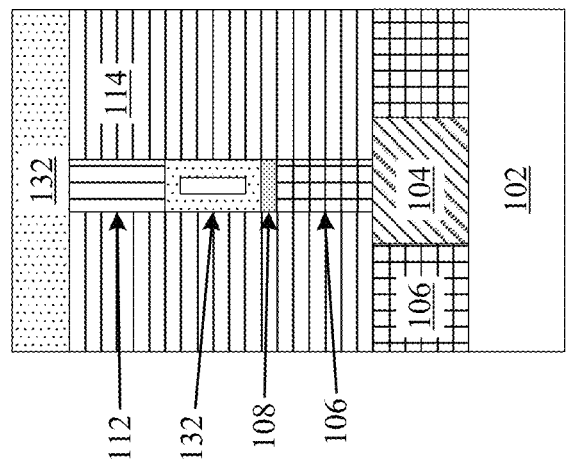
FIG. 10B illustrates cross section B of the PCM device after the formation of the phase change material, in accordance with the embodiment of the present invention.
Figure 10A:
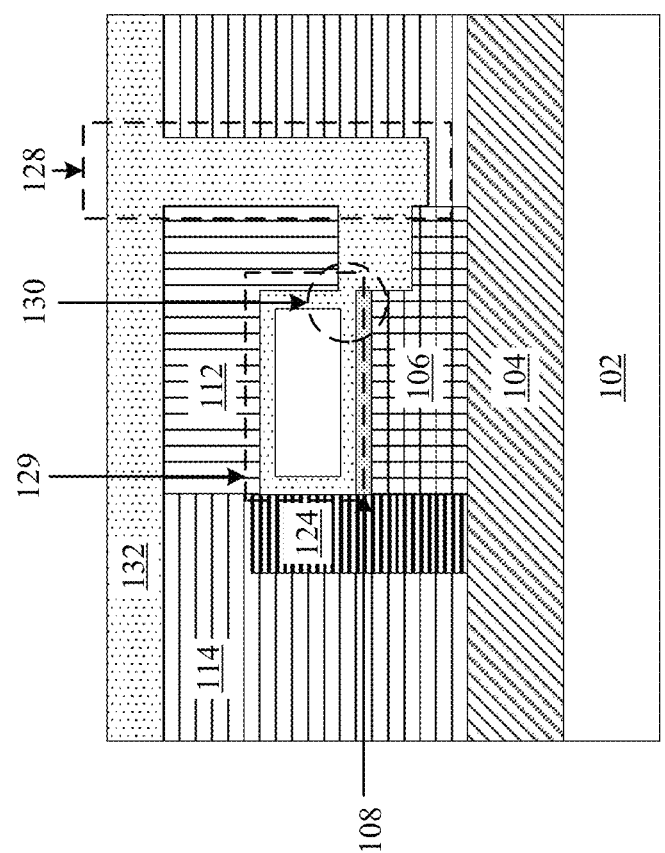
FIG. 10A illustrates cross section A of the PCM device after the formation of the phase change material layer, in accordance with the embodiment of the present invention.

FIG. 10A illustrates cross section A of the PCM device 100 after formation of the phase change material layer, in accordance with the embodiment of the present invention. FIG. 10B illustrates cross section B of the PCM device 100 after formation of the phase change material, in accordance with the embodiment of the present invention. A phase change material (PCM) layer 132 is formed by atomic layer deposition (ALD) or a similar deposition technique. The PCM layer 132 can be composed essentially of a phase change material such as a germanium-antimony-tellurium (GST), gallium-antimony-tellurium (GaST), or silver-iridium-antimony-telluride (AIST) material, although other materials can be used as appropriate. Other PCM materials can be used, including but not limited to, germanium-tellurium compound material (GeTe), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof. PCM material may be undoped or doped (e.g., doped with one or more of oxygen (O), nitrogen (N), silicon (Si), or titanium (Ti)). The terms "composed essentially" and "consist essentially," as used herein with respect to materials of different layers, indicates that other materials, if present, do not materially alter the basic characteristics of the recited materials. For example, a PCM material consisting essentially of GST material does not include other materials that materially alter the basic characteristics of the GST material.

The PCM layer 132 is formed by using an ALD or CVD process, thus allowing the PCM layer 132 to be formed along the walls within the cavity 129. The PCM layer 132 is further formed in the cavity created by the removal of the second sacrificial layer 120 and in the third column 128. The PCM layer 132 initially forms around the walls of the cavity 129 created by the removal of the first sacrificial layer 110, but the PCM layer 132 does not completely fill the cavity. The bottleneck 130 is pinched off by the PCM layer 132, thus preventing the PCM layer 132 from filling the cavity. FIGS. 10A and 10B illustrate that the PCM layer 132 is formed along the walls of the cavity 129 while the center of the cavity 129 remains empty.

FIG. 11A illustrates cross section A of the PCM device 100 after the PCM layer 132 is removed from the third column 128, in accordance with the embodiment of the present invention. FIG. 11B illustrates cross section B of the PCM device 100 after the PCM layer 132 is removed from the third column 128, in accordance with the embodiment of the present invention. The portion of the PCM layer 132 located on top of the ILD layer 114, the PCM layer 132 located on top of the hard mask 112, and the PCM layer 132 located within the third column 128 is removed. The removal of the PCM layer can be achieved, for example, by a reactive ion etch (RIE) process.

Figure 12A:
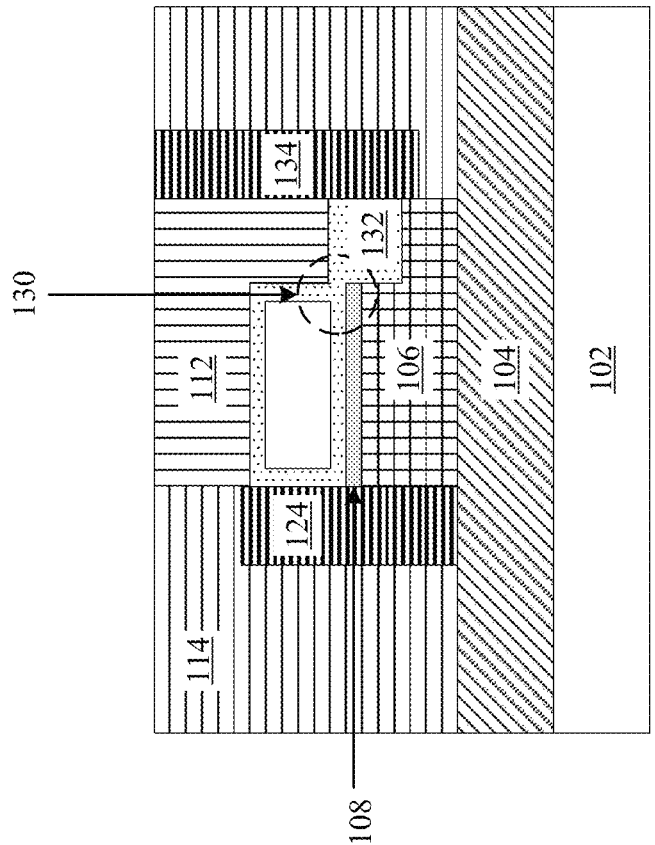
FIG. 12A illustrates cross section A of the PCM device after the creation of a second electrode, in accordance with the embodiment of the present invention.
Figure 12B:
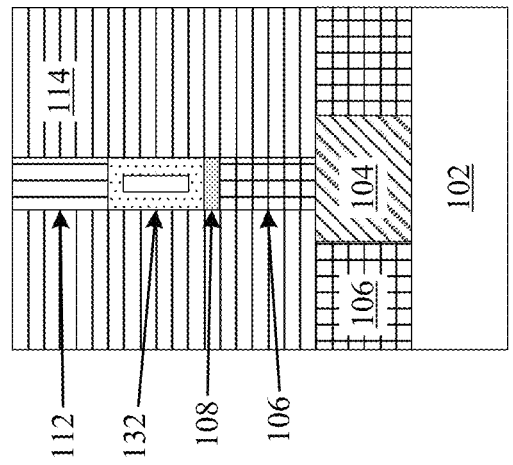
FIG. 12B illustrates cross section B of the PCM device after the creation of the second electrode, in accordance with the embodiment of the present invention.

FIG. 12A illustrates cross section A of the PCM device 100 after the creation of a second electrode 134, in accordance with the embodiment of the present invention. FIG. 12B illustrates cross section B of the PCM device 100 after the creation of the second electrode 134, in accordance with the embodiment of the present invention. A second electrode 134 is formed in the third column 128, where the second electrode 134 is in contact with the sidewall of the hard mask 112 and the sidewall of the PCM layer 132. Any excess material (e.g., material on top of the hard mask 112, and/or ILD layer 114) used to form the second electrode 134 is planarized, thus the top surface of the second electrode 134 is planar with the top of the hard mask 112 and the top surface of the ILD layer 114. The second electrode 134 can be comprised of, for example, Cu, W, or any other suitable conductive metal.

Figure 13B:
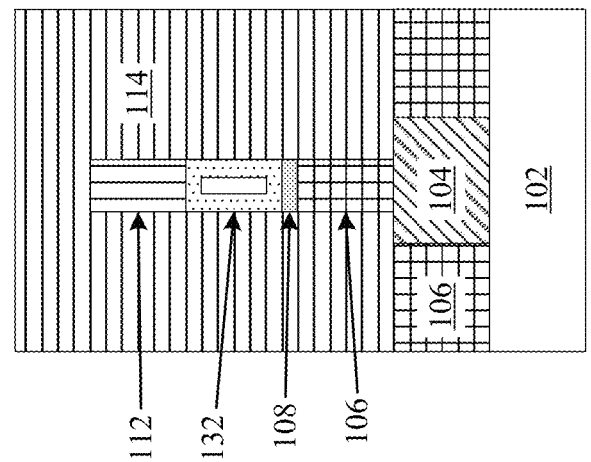
FIG. 13B illustrates cross section B of the PCM device after the creation of the top metal line, in accordance with the embodiment of the present invention.
Figure 13A:
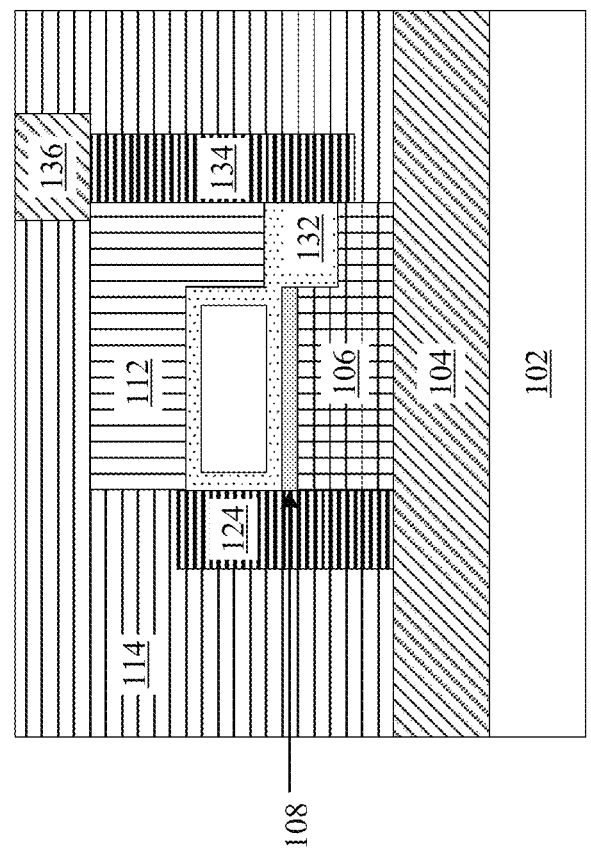
FIG. 13A illustrates cross section A of the PCM device after the creation of a top metal line, in accordance with the embodiment of the present invention.

FIG. 13A illustrates cross section A of the PCM device 100 after the creation of a top metal line 136, in accordance with the embodiment of the present invention. FIG. 13B illustrates cross section B of the PCM device 100 after the creation of the top metal line 136, in accordance with the embodiment of the present invention. Additional ILD material is deposited to expand the ILD layer 114, such that, the additional ILD material is formed on top of the hard mask 112, the second electrode 134, and the previous formed ILD layer 114. The ILD layer 114 is patterned to form a cavity located on top of the second electrode 134. A top metal line 136 is formed in the cavity located a top the second electrode 134. Therefore, the first electrode 124 is in contact with the bottom metal line 104, while the second electrode 134 is in contact with the second metal line 136.

Figure 14B:
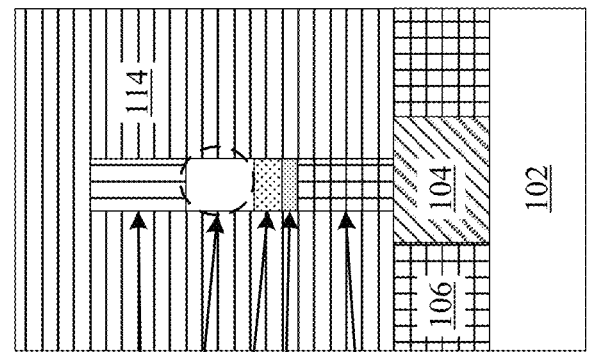
FIG. 14B illustrates cross section B of the PCM device after the formation of the airgap, in accordance with the embodiment of the present invention.
Figure 14A:
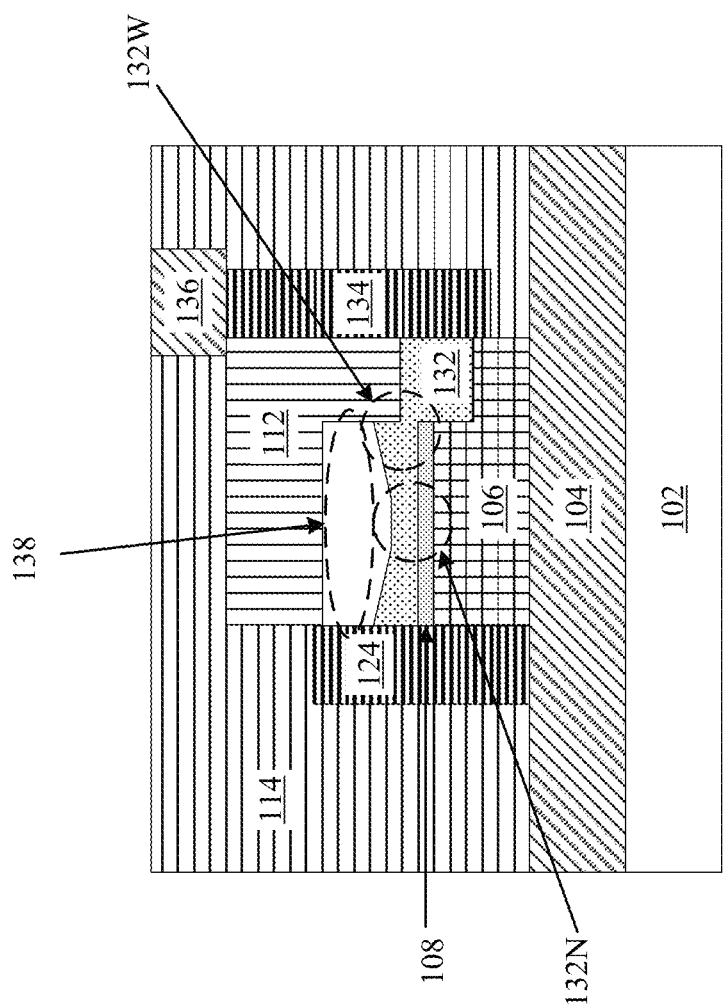
FIG. 14A illustrates cross section A of the PCM device after the formation of the airgap, in accordance with the embodiment of the present invention.

FIG. 14A illustrates cross section A of the PCM device 100 after the formation of the airgap 138, in accordance with the embodiment of the present invention. FIG. 14B illustrates cross section B of the PCM device 100 after the formation of the airgap 138, in accordance with the embodiment of the present invention. Electrical pulses are passed through the bottom electrode 124, the PCM layer 132, and the top electrode 134. The electrical pulses heat the PCM layer 132 that is formed around the walls of the cavity 129 causing the PCM layer 132 to change phases and to collect in the bottom of the cavity 129. The PCM layer 132 located on the optional resistive liner 108 has a thickness that varies along the horizontal axis of the cavity 129. The PCM layer 132 has a thicker region 132W that is located closer to the sidewalls of the cavity 129. The PCM layer 132 has a narrow region 132N that in the center region of the cavity 129. An airgap 138 is formed above the PCM layer 132 within the cavity 129. The airgap 138 is comprised of empty space or a void of materials. The airgap 138 is created by the melting of the PCM layer 132 initially located on the sides and top of the cavity 129. The section of the PCM layer 132 that is located below the airgap 138 has a variable thickness, such that, the PCM layer 132 is thicker towards the side of the airgap 138 (the sidewall of cavity 129) and thinner in towards the center of the airgap 138. The airgap 138 allows for the volume of the PCM layer 132 to expand and restrict during the operation/programming of the PCM device 100.

FIG. 15A illustrates cross section A of the PCM device 200 after a material stack formation, in accordance with the embodiment of the present invention. FIG. 15B illustrates cross section B of the PCM device 200 after the material stack formation, in accordance with the embodiment of the present invention. The PCM device 200 includes a substrate 202, a bottom metal line 204, a first dielectric layer 206, a phase change memory (PCM) layer 208, a barrier layer 210, a sacrificial layer 212, and a hard mask 214. The substrate 202 can be, for example, a material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate 202. In some embodiments, the substrate 202 includes both semiconductor materials and dielectric materials. The semiconductor substrate 202 may also comprise an organic semiconductor or a layered semiconductor such as, for example, Si/SiGe, a silicon-on-insulator or a SiGe-on-insulator. A portion or entire semiconductor substrate 202 be amorphous, polycrystalline, or monocrystalline. The semiconductor substrate 202 may be doped, undoped or contain doped regions and undoped regions therein. In some embodiments, the substrate 202 includes other device structures (not shown) such as transistors, isolation structures (such as shallow trench isolations), contacts, conducting wires, etc, or any suitable layer that can act as the base for the PCM device 200. The first dielectric layer 206 can be comprised of, for example, SiN or any other suitable dielectric material.

The PCM layer 208 composed essentially of a phase change material such as a germanium-antimony-tellurium (GST), gallium-antimony-tellurium (GaST), or silver-iridium-antimony-telluride (AIST) material, although other materials can be used as appropriate. Other PCM materials can be used, including but not limited to, germanium-tellurium compound material (GeTe), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof. PCM material 112 may be undoped or doped (e.g., doped with one or more of oxygen (O), nitrogen (N), silicon (Si), or titanium (Ti)). The terms "composed essentially" and "consist essentially," as used herein with respect to materials of different layers, indicates that other materials, if present, do not materially alter the basic characteristics of the recited materials. For example, a PCM material 112 consisting essentially of GST material does not include other materials that materially alter the basic characteristics of the GST material. The barrier layer 210 acts as a diffusion barrier to prevent the mixing of the PCM layer 208 and the first sacrificial layer 212. The barrier layer 210 can be comprised of, for example, $SiO_2$ or other suitable barrier material.

FIG. 16A illustrates cross section A of the PCM device 200 after formation of an masking layer 216, in accordance with the embodiment of the present invention. FIG. 16B illustrates cross section B of the PCM device 200 after formation of the masking layer 216, in accordance with the embodiment of the present invention. A masking layer 216 is formed on top of the hard mask 214. The masking layer 216 is patterned (e.g., by lithography followed by reactive ion etch (RIE)) for the formation of the columns that make up the PCM device 200. The masking layer 216 can be comprised of, for example, amorphous silicon.

Figure 17B:
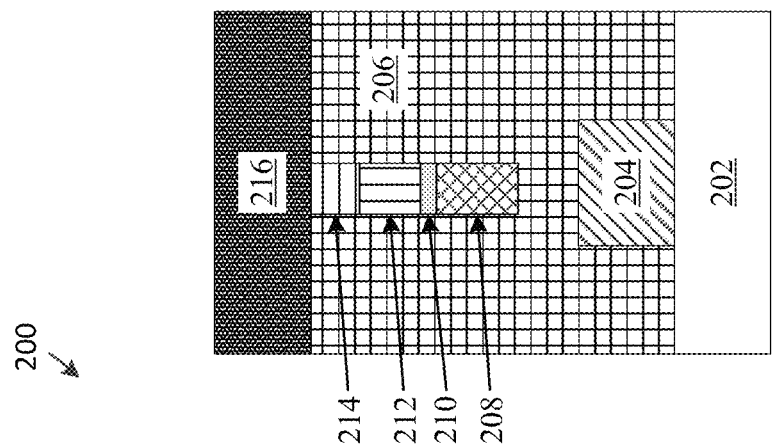
FIG. 17B illustrates cross section B of the PCM device after formation of columns, in accordance with the embodiment of the present invention.
Figure 17A:
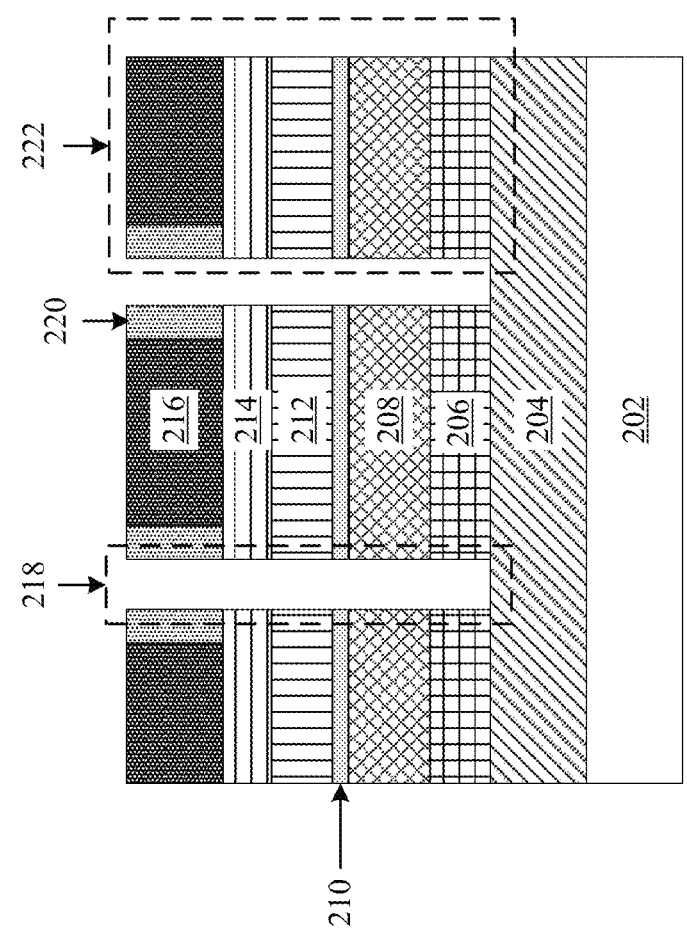
FIG. 17A illustrates cross section A of the PCM device after formation of columns, in accordance with the embodiment of the present invention.

FIG. 17A illustrates cross section A of the PCM device 200 after formation of columns, in accordance with the embodiment of the present invention. FIG. 17B illustrates cross section B of the PCM device 200 after formation of columns, in accordance with the embodiment of the present invention. The PCM column 222 are created by removing materials from the different layers to create cutout 218. The cutout 218 extends down from the top of the masking layer 216 to the top surface of the bottom metal line 204. The masking layer 216 is recessed back to allow the formation of a first spacer 220. The first spacer 220 is formed on top of the hard mask 214 on each side of the cutout 218, and the first spacer 220 is adjacent to the masking layer 216. The first spacer 220 are located where the electrodes will be fabricated in a downstream process. The first spacer 220 can be comprised of, for example, SiN.

Figures 18A, 18B:
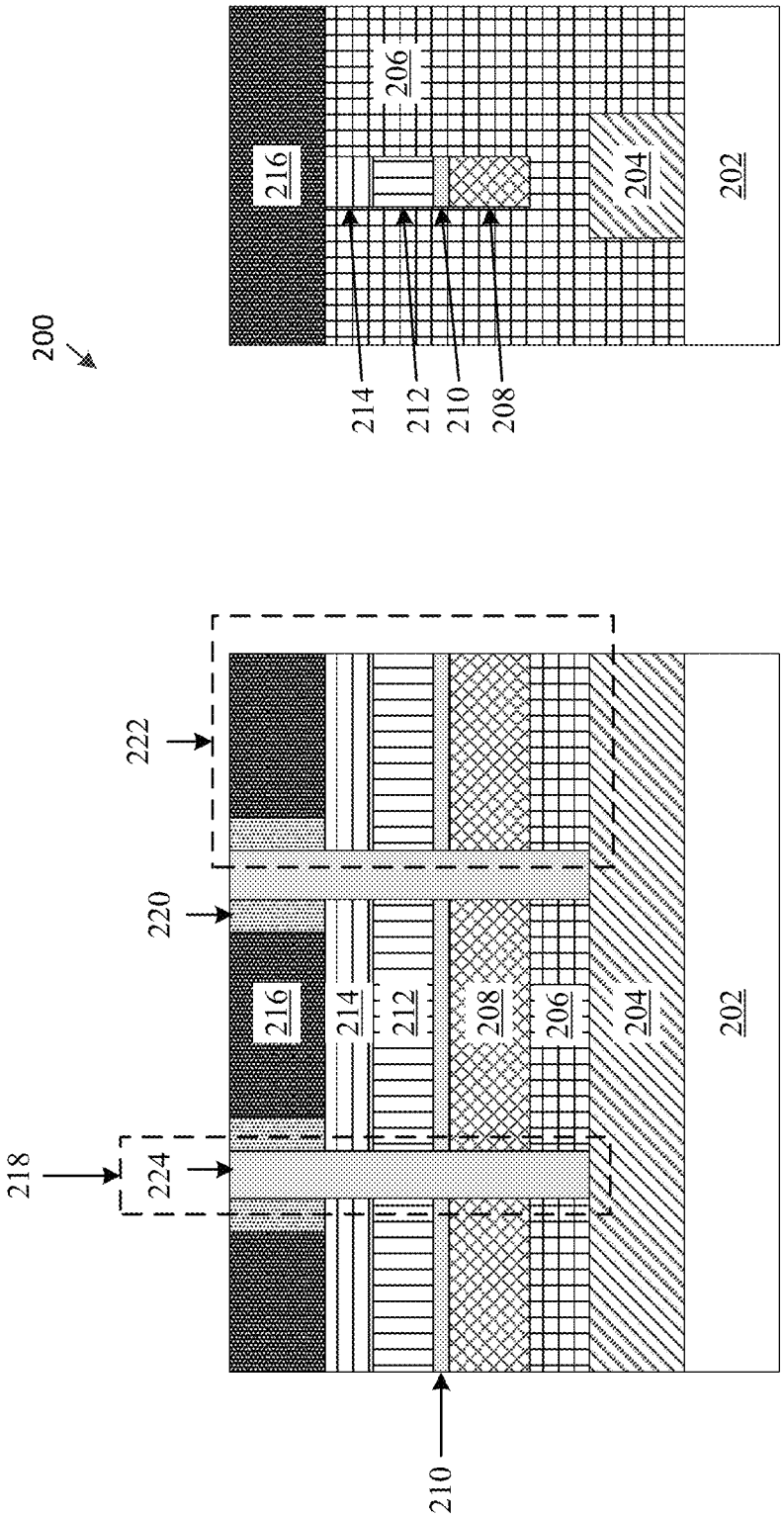
FIG. 18A illustrates cross section A of the PCM device after dielectric isolation of the different PCM columns, in accordance with the embodiment of the present invention.
FIG. 18B illustrates cross section B of the PCM device after dielectric isolation of the different PCM columns, in accordance with the embodiment of the present invention.

FIG. 18A illustrates cross section A of the PCM device 200 after dielectric isolation of the different PCM columns 222, in accordance with the embodiment of the present invention. FIG. 18B illustrates cross section B of the PCM device 200 after dielectric isolation of the different PCM columns 222, in accordance with the embodiment of the present invention. The cutouts 218 are filled with an isolation layer 224. The isolation layer 224 electrically isolates adjacent PCM columns 222 from each other. The isolation layer 224 can be comprised of a dielectric material such as $SiO_2$ or any other suitable dielectric.

Figure 19B:
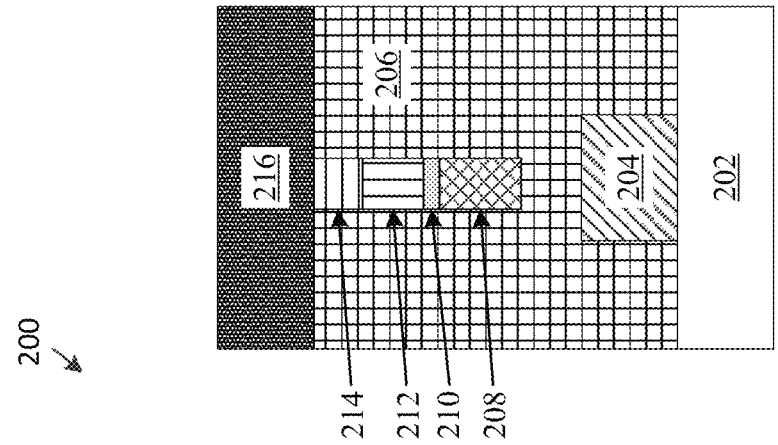
FIG. 19B illustrates cross section B of the PCM device after formation of the cutouts for the electrodes, in accordance with the embodiment of the present invention.
Figure 19A:
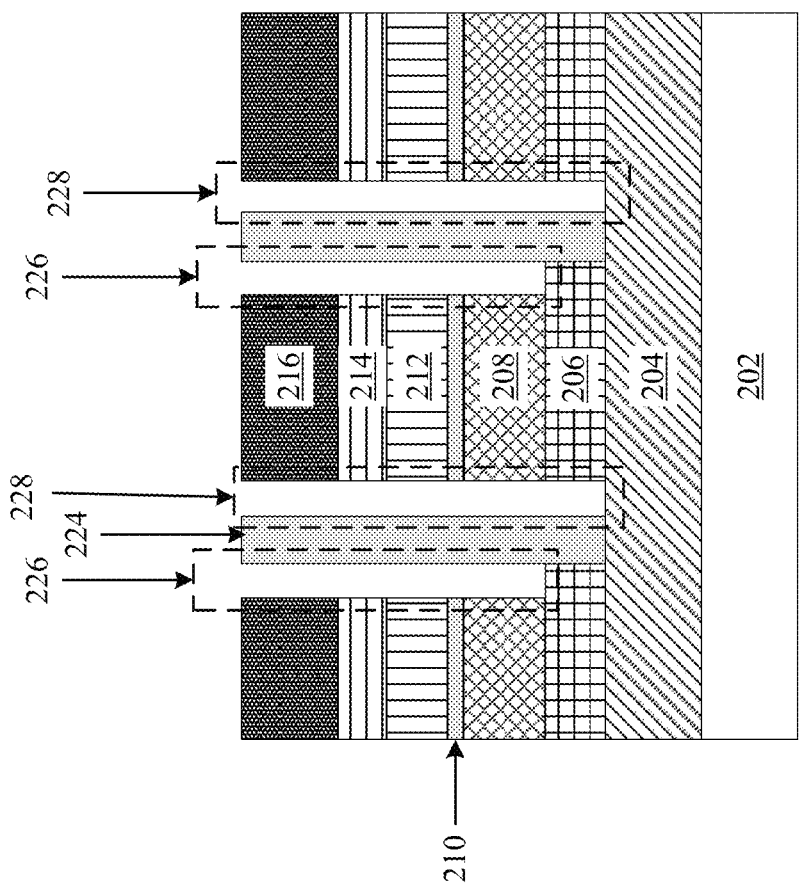
FIG. 19A illustrates cross section A of the PCM device after formation of the cutouts for the electrodes, in accordance with the embodiment of the present invention.

FIG. 19A illustrates cross section A of the PCM device 200 after formation of the cutouts for the electrodes, in accordance with the embodiment of the present invention. FIG. 19B illustrates cross section B of the PCM device 200 after formation of the cutouts for the electrodes, in accordance with the embodiment of the present invention. The first spacer 220 are removed and the electrode trenches 226, 228 are formed on either side of the isolation layer 224. The first electrode trench 226 extends downward from the top of the masking layer 216 to the top of the dielectric layer 206. The first electrode trench 226 is located adjacent to a first side of the isolation layer 224. The second electrode trench 228 extends downward from the top of the masking layer 216 to the top of the bottom metal line 204. The second electrode trench 228 is located adjacent to a second side of the isolation layer 224, where the first side is opposite the second side.

Figure 20B:
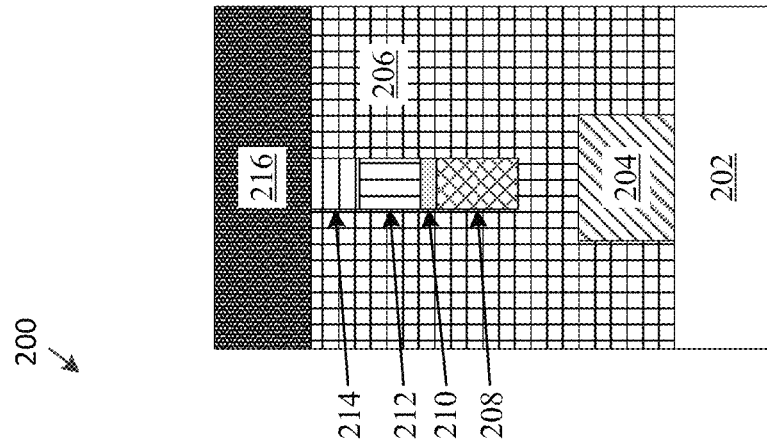
FIG. 20B illustrates cross section B of the PCM device after formation of the first and second electrodes, in accordance with the embodiment of the present invention.
Figure 20A:
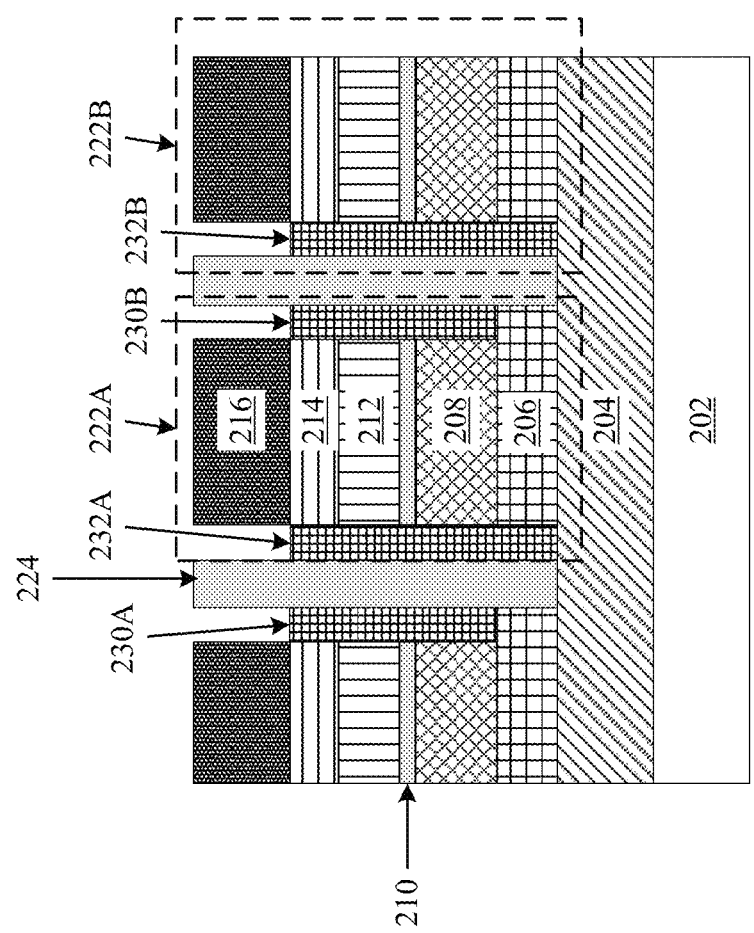
FIG. 20A illustrates cross section A of the PCM device after formation of the first and second electrodes, in accordance with the embodiment of the present invention.

FIG. 20A illustrates cross section A of the PCM device 200 after formation of the first and second electrodes, in accordance with the embodiment of the present invention. FIG. 20B illustrates cross section B of the PCM device 200 after formation of the first and second electrodes, in accordance with the embodiment of the present invention. A first electrode 230A and 230B are formed in the first electrode trench 226. A second electrode 232A and 232B are formed in the second electrode trench 228. The first electrode 230A is separated from the second electrode 232A by the isolation layer 224. The first electrode 230A and the second electrode 232A are connected to different PCM columns 222. For example, first electrode 230B and the second electrode 232A are connected to the first PCM column 222A, while the second electrode 232B is connected to a second PCM column 222B. Another first electrode (not shown) will be connected to the second PCM column 222B. The second electrode 232A and the first electrode 230B are located on opposite sides of the first PCM column 222A. The first electrodes 230A and 230B and the second electrodes 232A and 232B can be comprised of, for example, tungsten (W), copper (Cu), cobalt (Co), tantalum nitride (TaN) titanium nitride (TiN), ruthenium (Ru), or any other suitable conductive metal. The first electrodes 230A and 230B and the second electrodes 232A and 232B can comprise a single conductive material or any suitable combination of conductive materials.

FIG. 21A illustrates cross section A of the PCM device 200 after formation of a second spacer 234, in accordance with the embodiment of the present invention. FIG. 21B illustrates cross section B of the PCM device 200 after formation of the second spacer 234, in accordance with the embodiment of the present invention. A second spacer 234 is formed on top of each of the first electrodes 230A and 230B and on top of each of the second electrodes 232A and 232B. The second spacer 234 can be comprised of a dielectric material such as SiN.

FIG. 22A illustrates cross section A of the PCM device 200 after formation of a third spacer, in accordance with the embodiment of the present invention. FIG. 22B illustrates cross section B of the PCM device 200 after formation of the third spacer, in accordance with the embodiment of the present invention. The masking layer 216 is removed and a third spacer 236 is formed on top of the hard mask 214 and the dielectric layer 206. The third spacer 236 can be comprised of a dielectric material such as $SiO_2$. The third spacer 236 is patterned to indicate where the removal channels will be formed in each of the PCM columns 222.

Figure 23B:
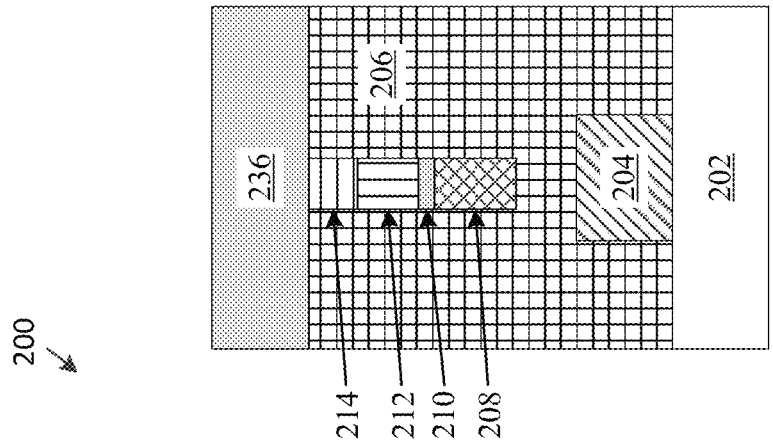
FIG. 23B illustrates cross section B of the PCM device after formation of the removal channel, in accordance with the embodiment of the present invention.
Figure 23A:
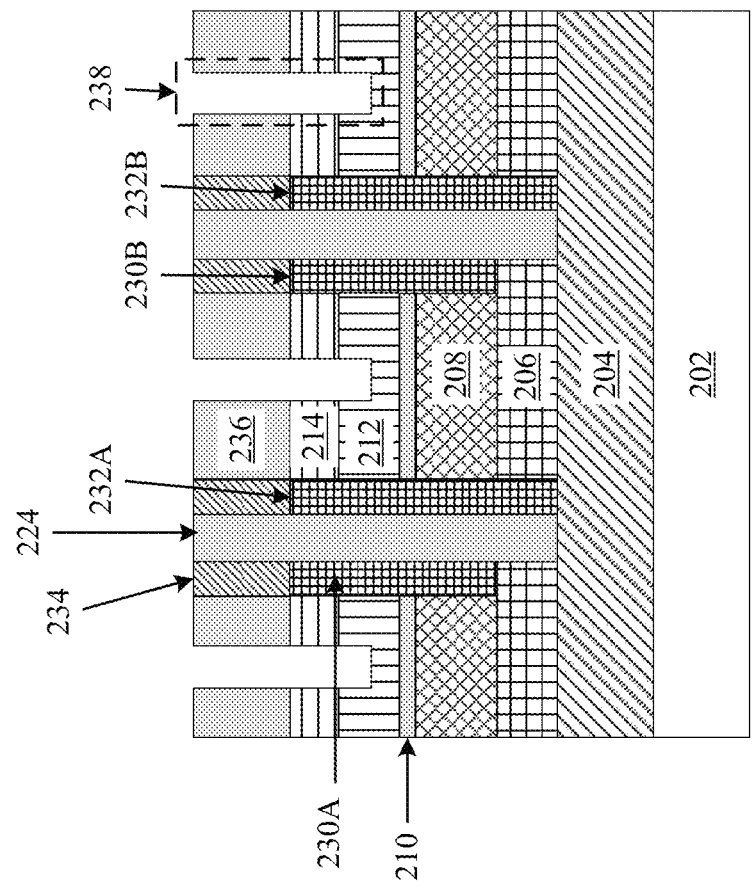
FIG. 23A illustrates cross section A of the PCM device after formation of a removal channel, in accordance with the embodiment of the present invention.

FIG. 23A illustrates cross section A of the PCM device 200 after formation of a removal channel 238, in accordance with the embodiment of the present invention. FIG. 23B illustrates cross section B of the PCM device 200 after formation of the removal channel 238, in accordance with the embodiment of the present invention. A removal channel 238 is etched into each of the PCM columns 222. The removal channel 238 extends downwards into the first sacrificial layer 212. The bottom of the removal channel 238 is located within the first sacrificial layer 212. The removal channel 238 allows for an etching solution to be applied to the first sacrificial layer 212.

Figure 24B:
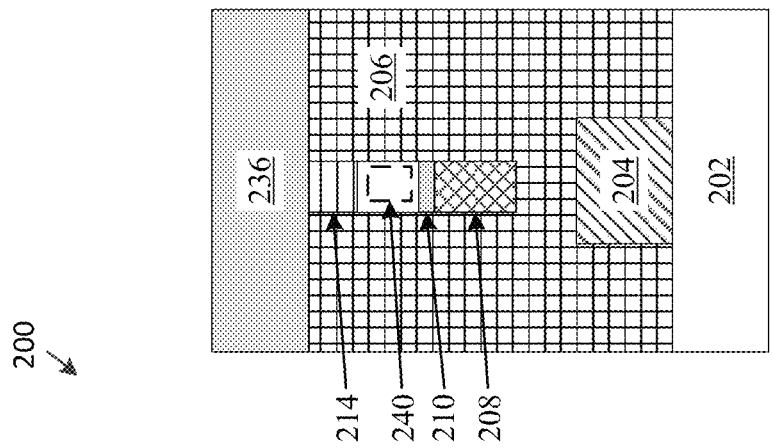
FIG. 24B illustrates cross section B of the PCM device after removal of the first sacrificial layer, in accordance with the embodiment of the present invention.
Figure 24A:
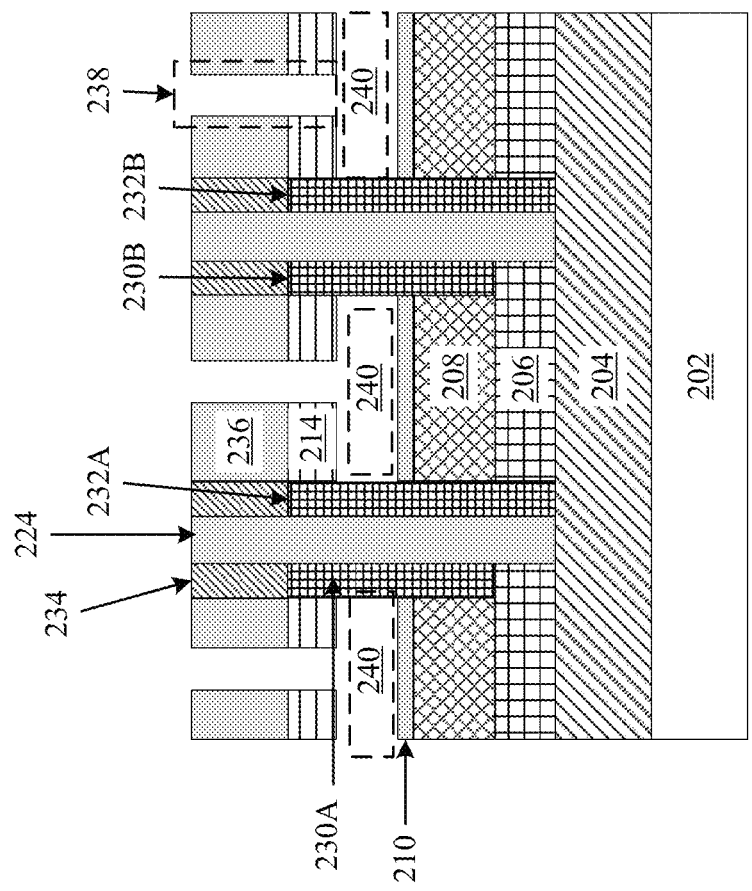
FIG. 24A illustrates cross section A of the PCM device after removal of the first sacrificial layer, in accordance with the embodiment of the present invention.

FIG. 24A illustrates cross section A of the PCM device 200 after removal of the first sacrificial layer 212, in accordance with the embodiment of the present invention. FIG. 24B illustrates cross section B of the PCM device 200 after removal of the first sacrificial layer 212, in accordance with the embodiment of the present invention. An etching solution is introduced into each of the removal channels 238, where the etching solution interacts with the first sacrificial layer 212. The etching solution and a rinse process causes the first sacrificial layer 212 to be removed from each of the PCM columns 222. some embodiments, the first sacrificial layer 212 comprise SiGe or Ge which can be removed, for example, by an aqueous solution containing ammonia and hydrogen peroxide, or by a gas phase hydrogen chloride (HCl). A cavity 240 is created by the removal of the first sacrificial layer 212 in each of the PCM columns 222. The cavity 240 or airgap allows for the PCM layer 208 to expand and restrict during the operation/programming of the PCM device 200.

Figures 25A, 25B:
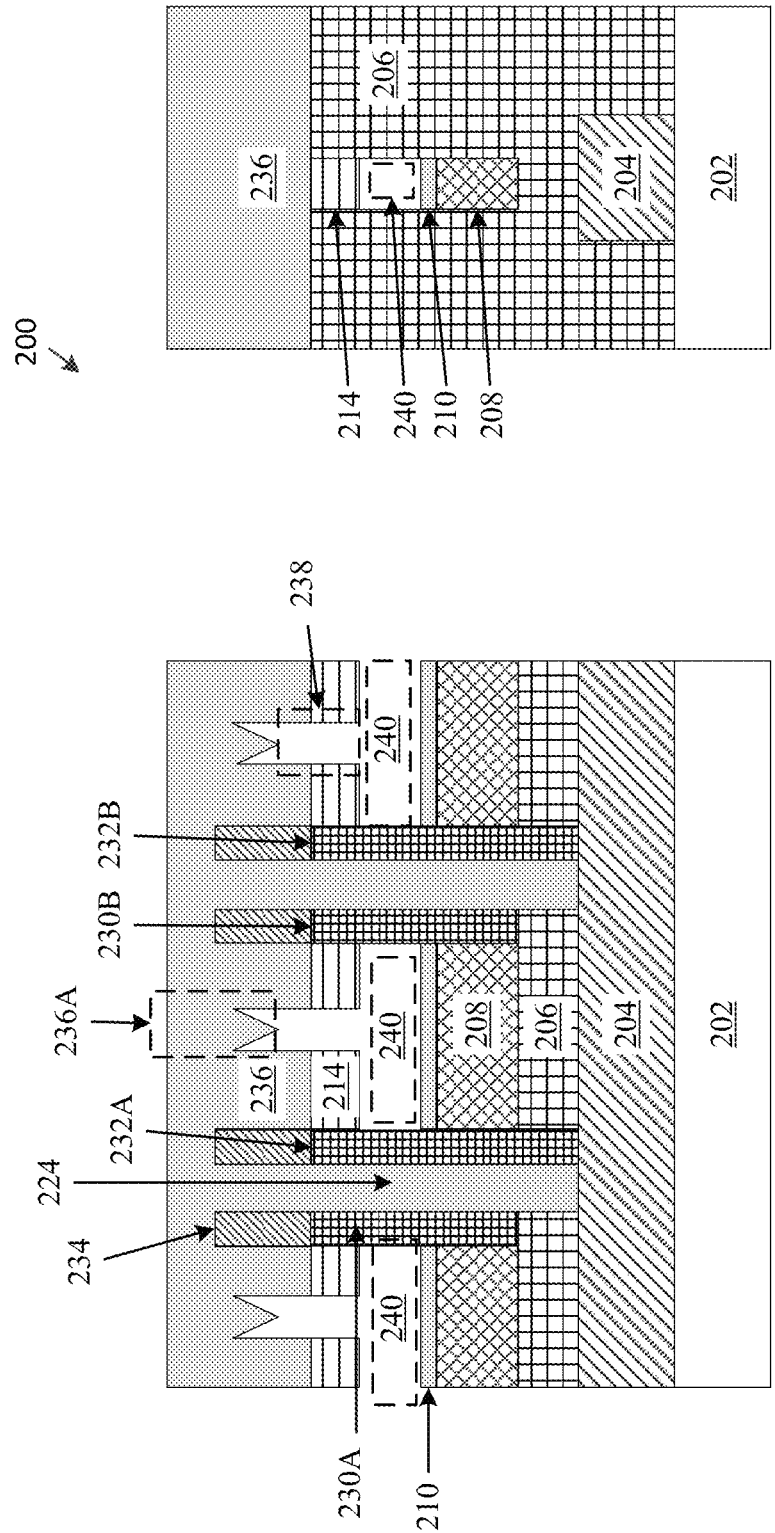
FIG. 25A illustrates cross section A of the PCM device after the removal channel is sealed, in accordance with the embodiment of the present invention.
FIG. 25B illustrates cross section B of the PCM device after the removal channel is sealed, in accordance with the embodiment of the present invention.

FIG. 25A illustrates cross section A of the PCM device 200 after the removal channel is sealed, in accordance with the embodiment of the present invention. FIG. 25B illustrates cross section B of the PCM device 200 after the removal channel is sealed, in accordance with the embodiment of the present invention. Additional third spacer 236 material is deposited on top of the previously formed third spacer 236 to seal each of the removal channels 238. The new third spacer 236A extends down into the removal channel but does not extend down into the cavity 240.

Figures 26A, 26B:
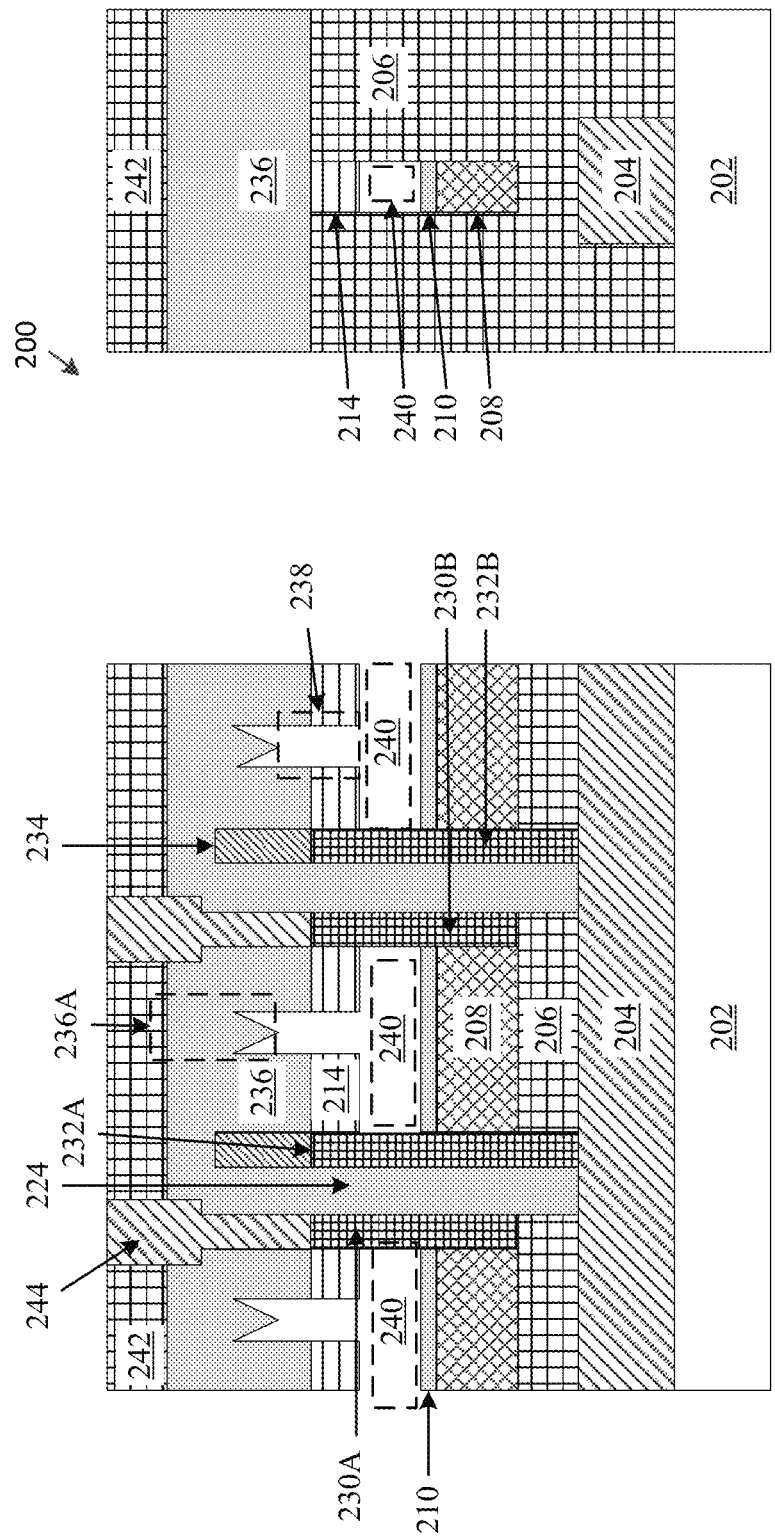
FIG. 26A illustrates cross section A of the PCM device after the formation of the upper metal line, in accordance with the embodiment of the present invention.
FIG. 26B illustrates cross section B of the PCM device after the formation of the upper metal line, in accordance with the embodiment of the present invention.

FIG. 26A illustrates cross section A of the PCM device 200 after the formation of the upper metal line 244, in accordance with the embodiment of the present invention. FIG. 26B illustrates cross section B of the PCM device 200 after the formation of the upper metal line 244, in accordance with the embodiment of the present invention. A second dielectric layer 242 is formed on top of the third spacer 236. The second dielectric layer 242 is patterned to expose the second spacer 234 located on top of the first electrodes 230A and 230B. The exposed second spacer 234 is removed to expose the top of the first electrodes 230A and 230B. An upper metal line 244 is formed on top of the first electrodes 230A and 230B. The cavity 240/airgap is able to accommodate the volume changes of the PCM layer 208 when electrical current/pulses are applied to the first electrode 230B or the second electrode 232A via the upper metal line 244 or the bottom metal lines 204.

Figures 27A, 27B:
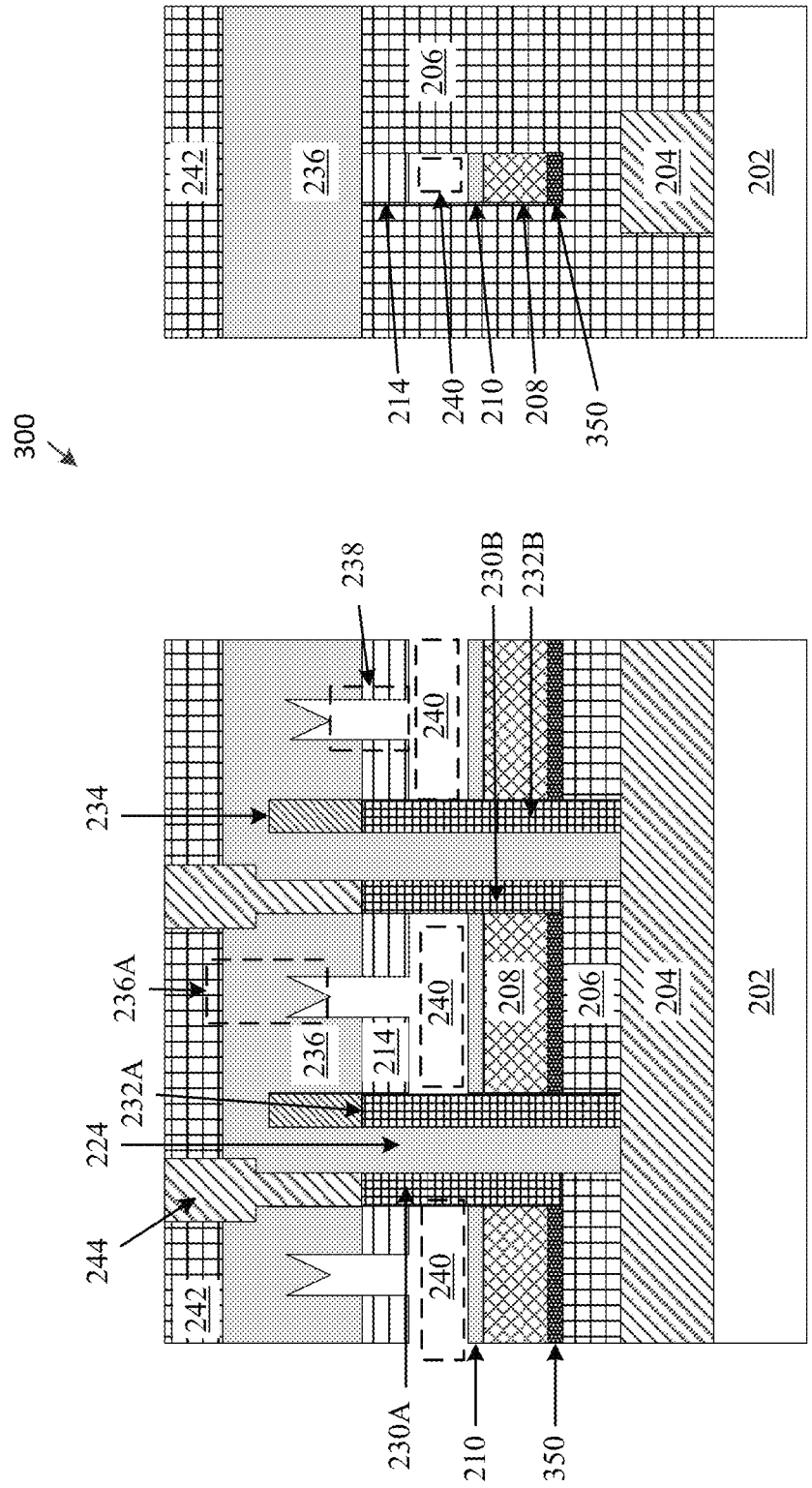
FIG. 27A illustrates cross section A of the PCM device with the inclusion of a resistive liner located below the PCM layer, in accordance with the embodiment of the present invention.
FIG. 27B illustrates cross section B of the PCM device of a resistive liner located below the PCM layer, in accordance with the embodiment of the present invention.

FIG. 27A illustrates cross section A of the PCM device 300 with the inclusion of a resistive liner 350 located below the PCM layer, in accordance with the embodiment of the present invention. FIG. 27B illustrates cross section B of the PCM device 300 of a resistive liner 350 located below the PCM layer, in accordance with the embodiment of the present invention. The PCM device 300 is the same as PCM device 200 as described above. The steps to form the cavity 240 in PCM device 300 is the same as the steps to form cavity 240 in PCM device 200. The layers and the references numbers used in FIGS. 27A and 27B correspond to the same layers and references numbers used above. The difference is when forming the initial PCM device 300 that an additional resistive liner 350 is formed on top of the first dielectric layer 206 and that the PCM layer 208 is formed on top of the resistive liner 350. The resistive liner 350 can be comprised of for example, for example, amorphous carbon, tantalum nitride (TaN), tungsten nitride (WN), cobalt tungsten (CoW), nickel tungsten (NiW), yttrium oxide (YO), or any other suitable materials. The resistance of the resistive liner 350 is substantially greater than the resistance of the PCM material in low resistance state (e.g., ten to forty times higher, or about twenty times higher) and substantially lower than the resistance of the PCM material in high resistance state (e.g., five to fifty times lower, or about ten times lower). The resistive liner 350 migrates resistance drift of the PCM layer 208 during operation of the PCM device 300.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A phase change memory (PCM) cell comprising:
   a bottom metal line located on top of a substrate;
   a dielectric layer located above a bottom metal line;
   a phase change material layer located above the dielectric layer;
   a barrier layer located on top of the phase change material layer,
   an airgap is located directly above the barrier layer, wherein the airgap provides space for the phase change material to expand or restrict, wherein the phase change material is located completely beneath the air gap.

2. The PCM cell of claim 1, wherein the air gap has a horizontal section and a vertical section.

3. The PCM cell of claim 2, further comprising:
   a first layer forming a top boundary of portions of the horizontal section of the airgap, wherein the vertical section of the air gap extends between sections of the first layer.

4. The PCM cell of claim 1, further comprising:
   a first electrode connected to the phase change material and a second electrode connected to the phase change material.

5. The PCM cell of claim 4, wherein the first electrode is connected to a first side surface of the phase change material and the second electrode is connected to a second side surface of the phase change material.

6. The PCM cell of claim 5, wherein the first electrode forms a first side boundary of the air gap.

7. The PCM cell of claim 6, wherein the second electrode forms a second side boundary of the air gap.

8. The PCM cell of claim 7, wherein the first electrode extends up from the bottom metal line.

9. The PCM cell of claim 8 further comprising:
   a top metal line, wherein the second electrode extends downwards from a top metal line.

10. A phase change memory (PCM) cell comprising:
    a bottom metal line located on top of a substrate;
    a dielectric layer located above a bottom metal line;
    a resistive liner located directly on top of the dielectric layer;
    a phase change material layer located above the dielectric layer;
    a barrier layer located on top of the phase change material layer, wherein the phase change material is sandwiched between the resistive liner and the barrier layer;
    an airgap is located directly above the barrier layer, wherein the airgap provides space for the phase change material to expand or restrict, wherein the phase change material is located completely beneath the air gap.

11. The PCM cell of claim 10, wherein the air gap has a horizontal section and a vertical section.

12. The PCM cell of claim 11, further comprising:
    a first layer forming a top boundary of portions of the horizontal section of the airgap, wherein the vertical section of the air gap extends between sections of the first layer.

13. The PCM cell of claim 10, further comprising:
    a first electrode connected to the phase change material and a second electrode connected to the phase change material.

14. The PCM cell of claim 13, wherein the first electrode is connected to a first side surface of the phase change material and the second electrode is connected to a second side surface of the phase change material.

15. The PCM cell of claim 14, wherein the first electrode forms a first side boundary of the air gap.

16. The PCM cell of claim 15, wherein the second electrode forms a second side boundary of the air gap.

17. The PCM cell of claim 16, wherein the first electrode extends up from the bottom metal line.

18. The PCM cell of claim 17 further comprising:
    a top metal line, wherein the second electrode extends downwards from a top metal line.

19. A method comprising:
    forming a bottom metal line located on top of a substrate;
    forming a dielectric layer located above a bottom metal line;
    forming a resistive liner located directly on top of the dielectric layer;
    forming a phase change material layer located above the dielectric layer;
    forming a barrier layer located on top of the phase change material layer, wherein the phase change material is sandwiched between the resistive liner and the barrier layer;
    forming a first trench and a second trench, wherein the first trench extends downwards to bottom metal line and the second trench extends downwards to the dielectric layer;
    forming a first electrode in the first trench and forming a second electrode in the second trench; and
    forming an airgap is located directly above the barrier layer and in between the first electrode and the second electrode, wherein the airgap provides space for the phase change material to expand or restrict, wherein the phase change material is located completely beneath the air gap.

20. The method of claim 19, wherein the phase change material is selected from a group consisting of germanium-tellurium compound material (GeTe), Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof.

* * * * *